(12) United States Patent
Parekh

(10) Patent No.: US 11,563,018 B2
(45) Date of Patent: Jan. 24, 2023

(54) MICROELECTRONIC DEVICES, AND RELATED METHODS, MEMORY DEVICES, AND ELECTRONIC SYSTEMS

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 16/905,385

(22) Filed: Jun. 18, 2020

(65) Prior Publication Data

US 2021/0398996 A1     Dec. 23, 2021

(51) Int. Cl.
*H01L 27/11556*     (2017.01)
*G11C 5/02*     (2006.01)
(Continued)

(52) U.S. Cl.
CPC ........ *H01L 27/11556* (2013.01); *G11C 5/025* (2013.01); *G11C 5/06* (2013.01);
(Continued)

(58) Field of Classification Search
CPC ......... H01L 27/11556; H01L 27/11582; H01L 23/5226; H01L 23/53214; H01L 23/53228; G11C 5/025; G11C 5/06
(Continued)

(56) References Cited

U.S. PATENT DOCUMENTS

| 4,925,809 A | 5/1990 | Yoshiharu et al. |
| 6,165,247 A | 12/2000 | Kodas et al. |

(Continued)

FOREIGN PATENT DOCUMENTS

| CN | 107768376 A | 3/2018 |
| CN | 107887395 A | 4/2018 |

(Continued)

OTHER PUBLICATIONS

International Search Report for Application No. PCT/US2021/033305, dated Sep. 7, 2021, 3 pages.
(Continued)

*Primary Examiner* — Tu-Tu V Ho
(74) *Attorney, Agent, or Firm* — TraskBritt

(57) ABSTRACT

A microelectronic device comprises a memory array region, a control logic region underlying the memory array region, and an interconnect region vertically interposed between the memory array region and the control logic region. The memory array region comprises a stack structure comprising vertically alternating conductive structures and insulating structures; vertically extending strings of memory cells within the stack structure; at least one source structure vertically overlying the stack structure and coupled to the vertically extending strings of memory cells; and digit line structures vertically underlying the stack structure and coupled to the vertically extending strings of memory cells. The control logic region comprises control logic devices for the vertically extending strings of memory cells. The interconnect region comprises structures coupling the digit line structures to the control logic devices. Methods of forming a microelectronic device, and memory devices and electronic systems are also described.

23 Claims, 10 Drawing Sheets

(51) Int. Cl.
*H01L 27/11582* (2017.01)
*H01L 23/522* (2006.01)
*H01L 23/532* (2006.01)
*G11C 5/06* (2006.01)

(52) U.S. Cl.
CPC .... *H01L 23/5226* (2013.01); *H01L 23/53214* (2013.01); *H01L 23/53228* (2013.01); *H01L 27/11582* (2013.01)

(58) Field of Classification Search
USPC .......................................................... 257/774
See application file for complete search history.

(56) References Cited

U.S. PATENT DOCUMENTS

| | | | |
|---|---|---|---|
| 7,372,091 B2 | 5/2008 | Leslie | |
| 7,897,485 B2 | 3/2011 | Parekh | |
| 8,042,082 B2 | 10/2011 | Solomon | |
| 8,958,228 B2 | 2/2015 | Samachisa et al. | |
| 9,196,753 B2 | 11/2015 | Ramaswamy et al. | |
| 9,397,145 B1 | 7/2016 | Sills et al. | |
| 9,449,652 B2 | 9/2016 | Juengling | |
| 9,515,083 B2 | 12/2016 | Lee et al. | |
| 9,530,790 B1 | 12/2016 | Lu et al. | |
| 9,553,263 B1 | 1/2017 | Petz et al. | |
| 9,590,012 B2 | 3/2017 | Lee et al. | |
| 9,653,617 B2 | 5/2017 | Zhou et al. | |
| 9,922,716 B2 | 3/2018 | Hsiung et al. | |
| 10,141,330 B1* | 11/2018 | Lindsay | H01L 27/1157 |
| 10,283,703 B2 | 5/2019 | Pellizzer et al. | |
| 10,381,362 B1 | 8/2019 | Cui et al. | |
| 10,665,580 B1 | 5/2020 | Hosoda et al. | |
| 10,847,220 B2 | 11/2020 | Castro | |
| 2003/0113669 A1 | 6/2003 | Cheng et al. | |
| 2003/0151083 A1 | 8/2003 | Matsui et al. | |
| 2005/0265076 A1 | 12/2005 | Forbes | |
| 2006/0076690 A1 | 4/2006 | Khandros et al. | |
| 2007/0288702 A1 | 12/2007 | Roohparvar | |
| 2008/0019165 A1 | 1/2008 | Lin et al. | |
| 2009/0168482 A1 | 7/2009 | Park et al. | |
| 2011/0159645 A1 | 6/2011 | Pekny | |
| 2011/0309431 A1 | 12/2011 | Kidoh et al. | |
| 2012/0161094 A1 | 6/2012 | Huo et al. | |
| 2012/0181602 A1 | 7/2012 | Fukuzumi et al. | |
| 2013/0126622 A1 | 5/2013 | Finn | |
| 2013/0130468 A1 | 5/2013 | Higashitani et al. | |
| 2014/0001583 A1 | 1/2014 | Teh et al. | |
| 2014/0061750 A1 | 3/2014 | Kwon et al. | |
| 2014/0124726 A1 | 5/2014 | Oh | |
| 2014/0175637 A1 | 6/2014 | Stuber et al. | |
| 2015/0091180 A1 | 4/2015 | Ong et al. | |
| 2015/0243708 A1 | 8/2015 | Ravasio et al. | |
| 2015/0278675 A1 | 10/2015 | Finn et al. | |
| 2016/0079164 A1 | 3/2016 | Fukuzumi et al. | |
| 2016/0104715 A1 | 4/2016 | Pachamuthu et al. | |
| 2016/0268304 A1 | 9/2016 | Ikeda et al. | |
| 2016/0343727 A1 | 11/2016 | Kim et al. | |
| 2017/0025421 A1 | 1/2017 | Sakakibara et al. | |
| 2017/0054036 A1 | 2/2017 | Dorhout et al. | |
| 2017/0092649 A1 | 3/2017 | Takaoka | |
| 2017/0148802 A1 | 5/2017 | Dorhout et al. | |
| 2018/0053768 A1 | 2/2018 | Kim et al. | |
| 2018/0108741 A1 | 4/2018 | Li et al. | |
| 2018/0158689 A1 | 6/2018 | Mumford | |
| 2019/0043836 A1 | 2/2019 | Fastow et al. | |
| 2019/0088493 A1 | 3/2019 | Watanabe et al. | |
| 2019/0096906 A1 | 3/2019 | Lindsay et al. | |
| 2019/0206861 A1 | 7/2019 | Beigel et al. | |
| 2019/0221557 A1 | 7/2019 | Kim et al. | |
| 2019/0229089 A1 | 7/2019 | Zhou et al. | |
| 2019/0355786 A1 | 11/2019 | Iguchi | |
| 2020/0006380 A1 | 1/2020 | Van et al. | |
| 2020/0013792 A1 | 1/2020 | Parekh et al. | |
| 2020/0013798 A1 | 1/2020 | Parekh | |
| 2020/0066745 A1* | 2/2020 | Yu | H01L 27/11582 |
| 2020/0083245 A1 | 3/2020 | Fayrushin et al. | |
| 2020/0098776 A1 | 3/2020 | Sugisaki | |
| 2020/0135541 A1 | 4/2020 | Wu et al. | |
| 2020/0159133 A1 | 5/2020 | Yan et al. | |
| 2020/0185406 A1 | 6/2020 | Li et al. | |
| 2020/0219815 A1 | 7/2020 | Elsherbini et al. | |
| 2020/0227397 A1 | 7/2020 | Yada et al. | |
| 2020/0258816 A1* | 8/2020 | Oki | H01L 25/0657 |
| 2020/0258876 A1 | 8/2020 | Hosoda et al. | |
| 2020/0258904 A1 | 8/2020 | Kai et al. | |
| 2020/0273840 A1 | 8/2020 | Elsherbini et al. | |
| 2021/0074711 A1 | 3/2021 | Suzuki et al. | |
| 2021/0082939 A1 | 3/2021 | Matsuda | |
| 2021/0296316 A1 | 9/2021 | Zhu | |
| 2021/0343690 A1 | 11/2021 | Salmon | |
| 2021/0398847 A1* | 12/2021 | Parekh | H01L 27/11556 |
| 2022/0028830 A1 | 1/2022 | Kirby | |

FOREIGN PATENT DOCUMENTS

| | | |
|---|---|---|
| CN | 108447865 A | 8/2018 |
| CN | 111247636 A | 6/2020 |
| JP | 2002-103299 A | 4/2002 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |

OTHER PUBLICATIONS

Written Opinion of the International Searching Authority for Application No. PCT/US2021/033305, dated Sep. 7, 2021, 3 pages.
Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.
Li et al., Skybridge-3D-CMOS: A Fine-Grained 3D CMOS Integrated Circuity Technology, IEEE Transactions on Nanotechnology, vol. 16, No. 4, Jul. 2017, pp. 639-652.
Micron, Introducing 2nd Generation Micron Mobile TLC 3D NAND, Industry-Leading Storage Solutions for Flagship Smartphones, (2018), 9 pages.
YMTC, About Xtacking, http://www.ymtc.com, visited Apr. 20, 2020, 3 pages.
Taiwanese First Office Action for Application No. 110119677, dated Jan. 26, 2022, 9 pages.

* cited by examiner

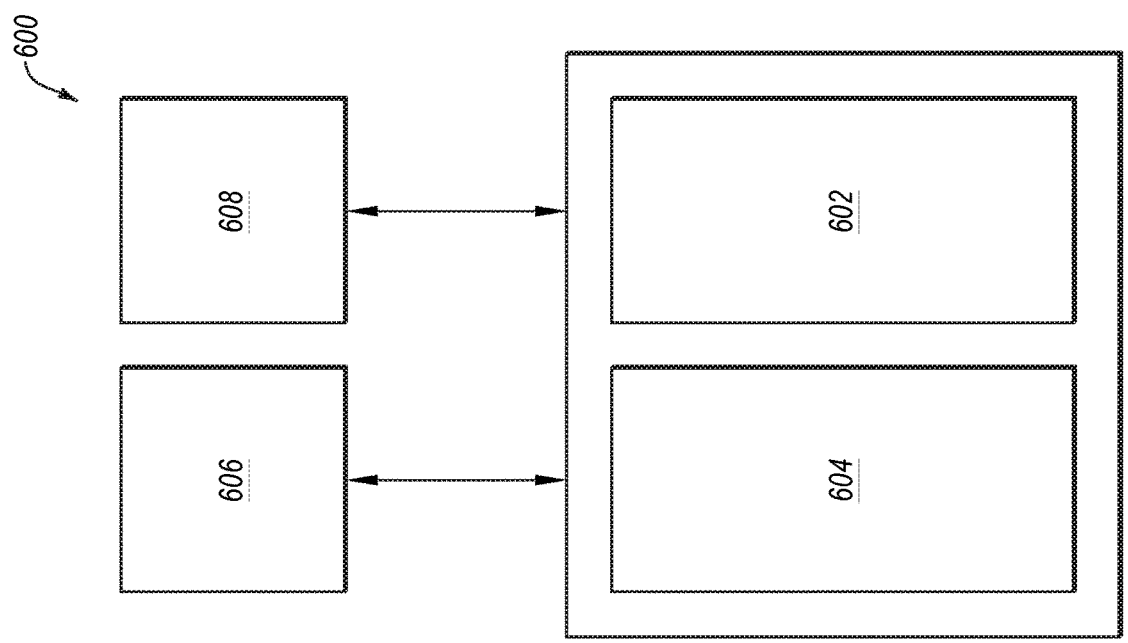

MICROELECTRONIC DEVICES, AND RELATED METHODS, MEMORY DEVICES, AND ELECTRONIC SYSTEMS

CROSS-REFERENCE TO RELATED APPLICATIONS

This application is related to U.S. patent application Ser. No. 16/905,452, filed Jun. 18, 2020, listing Kunal R. Parekh as inventor, for "METHODS OF FORMING MICROELECTRONIC DEVICES, AND RELATED MICROELECTRONIC DEVICES, MEMORY DEVICES, ELECTRONIC SYSTEMS, AND ADDITIONAL METHODS." This application is also related to U.S. patent application Ser. No. 16/905,698, filed Jun. 18, 2020, listing Kunal R. Parekh as inventor, for MICROELECTRONIC DEVICES AND ELECTRONIC SYSTEMS." This application is also related to U.S. patent application Ser. No. 16/905,747, filed Jun. 18, 2020, listing Kunal R. Parekh as inventor, for "MICROELECTRONIC DEVICES INCLUDING SOURCE STRUCTURES OVERLYING STACK STRUCTURES, AND RELATED ELECTRONIC SYSTEMS." This application is also related to U.S. patent application Ser. No. 16/905,763, filed Jun. 18, 2020, now U.S. Pat. No. 11,335,602, issued May 17, 2022, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,734, filed Jun. 18, 2020, now U.S. Pat. No. 11,380,669, issued Jul. 5, 2022, listing Kunal R. Parekh as inventor, for "METHODS OF FORMING MICROELECTRONIC DEVICES." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to microelectronic devices, and related methods, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and contact structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device.

BRIEF DESCRIPTION OF THE DRAWINGS

FIG. 7 is a schematic block diagram of an electronic system, in accordance with an embodiment of the disclosure.

DETAILED DESCRIPTION

Figure 1:
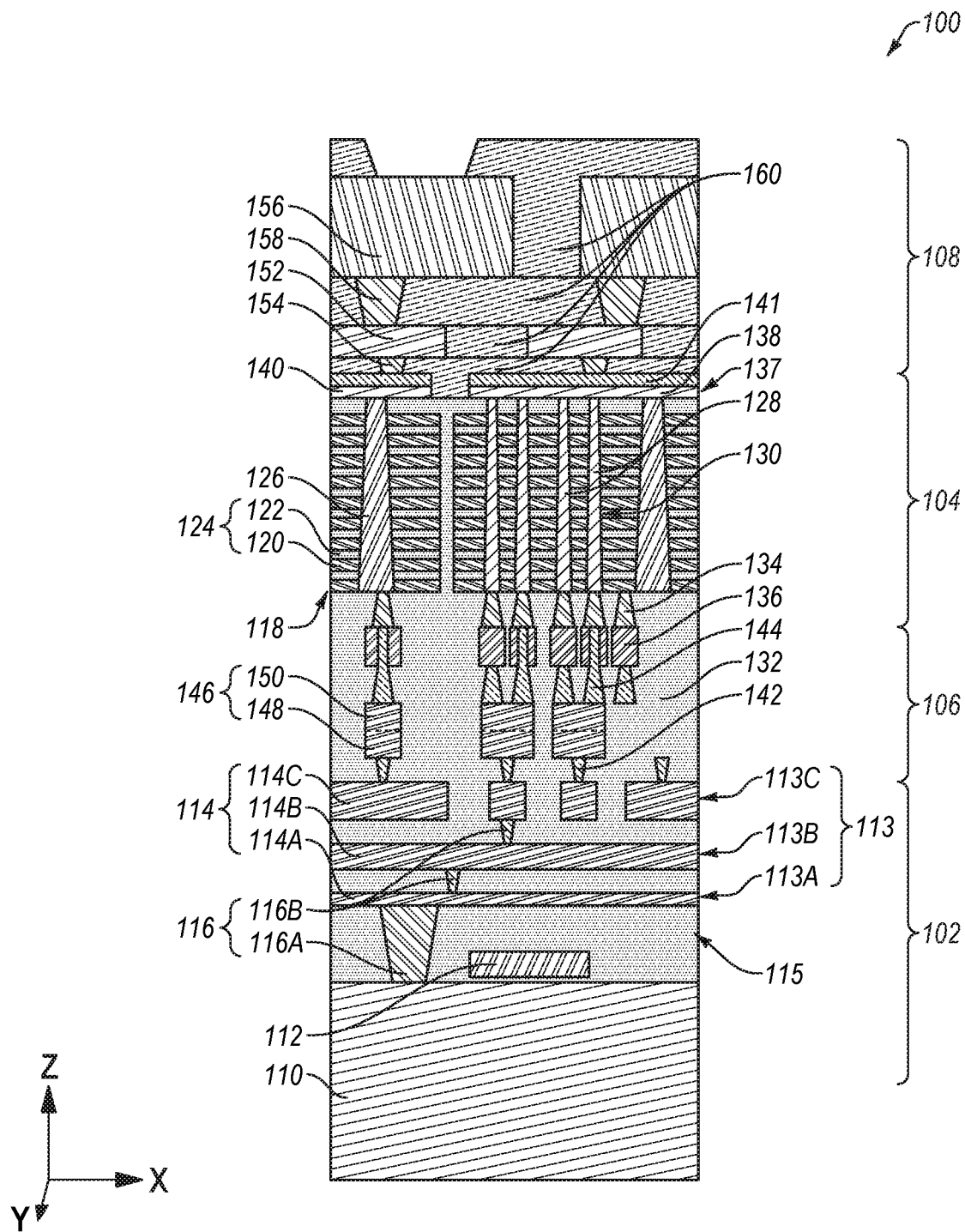
FIG. 1 is simplified, partial cross-sectional view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($Mgo_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xo_yH_z$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIG. 1 is a simplified, partial cross-sectional view of a microelectronic device 100 (e.g., a memory device, such as a 3D NAND Flash memory device), in accordance with embodiments of the disclosure. With the description provided below, it will be readily apparent to one of ordinary skill in the art that microelectronic devices described herein may be included in various relatively larger devices and various electronic systems.

Referring to FIG. 1, the microelectronic device 100 may include a control logic region 102, a memory array region 104, a first interconnect region 106, and a second interconnect region 108. As shown in FIG. 1, the first interconnect region 106 may vertically overlie (e.g., in the Z-direction) and be in electrical communication with the control logic region 102, and the memory array region 104 may vertically overlie and be in electrical communication with the first interconnect region 106. The first interconnect region 106 may be vertically interposed between and in electrical communication with the control logic region 102 and the memory array region 104. In addition, the second interconnect region 108 may vertically overlie and be in electrical communication with the memory array region 104. The memory array region 104 may be vertically interposed between and in electrical communication with the first interconnect region 106 and the second interconnect region 108.

The control logic region 102 of the microelectronic device 100 may include a semiconductive base structure 110, gate structures 112, first routing structures 114, and first contact structures 116. Portions of the semiconductive base structure 110, the gate structures 112, the first routing structures 114, and the first contact structures 116 form various control logic devices 115 of the control logic region 102, as described in further detail below.

The semiconductive base structure 110 (e.g., semiconductive wafer) of the control logic region 102 comprises a base material or construction upon which additional features (e.g., materials, structures, devices) of the microelectronic device 100 are formed. The semiconductive base structure 110 may comprise a semiconductive structure (e.g., a semiconductive wafer), or a base semiconductive material on a supporting structure. For example, the semiconductive base structure 110 may comprise a conventional silicon substrate (e.g., a conventional silicon wafer), or another bulk substrate comprising a semiconductive material. In some embodiments, the semiconductive base structure 110 comprises a silicon wafer. In addition, the semiconductive base structure 110 may include one or more layers, structures, and/or regions formed therein and/or thereon. For example, the semiconductive base structure 110 may include conductively doped regions and undoped regions. The conductively doped regions may, for example, be employed as source regions and drain regions for transistors of the control logic devices 115 of the control logic region 102; and the undoped regions may, for example, be employed as channel regions for the transistors of the control logic devices 115.

As shown in FIG. 1, the gate structures 112 of the control logic region 102 of the microelectronic device 100 may vertically overlie (e.g., in the Z-direction) portions of the semiconductive base structure 110. The gate structures 112 may individually horizontally extend between and be employed by transistors of the control logic devices 115 within the control logic region 102 of the microelectronic device 100. The gate structures 112 may be formed of and include conductive material. A gate dielectric material (e.g., a dielectric oxide) may vertically intervene (e.g., in the Z-direction) between the gate structures 112 and channel regions (e.g., within the semiconductive base structure 110) of the transistors.

The first routing structures 114 may vertically overlie (e.g., in the Z-direction) the semiconductive base structure 110, and may be electrically connected to the semiconductive base structure 110 by way of the first contact structures 116. The first routing structures 114 may serve as local routing structures for the microelectronic device 100. A first group 116A of the first contact structures 116 may vertically extend between and couple regions (e.g., conductively doped regions, such as source regions and drain regions) of the semiconductive base structure 110 to one or more of the first routing structures 114. In addition, a second group 116B of the first contact structures 116 may vertically extend between and couple some of the first routing structures 114 to one another.

The control logic region 102 may include multiple tiers 113 (e.g., levels) of the first routing structures 114. By way of non-limiting example, as shown in FIG. 1, the control logic region 102 may include three (3) tiers 113 of the first routing structures 114. Within each individual tier 113, the first routing structures 114 included therein may horizontally extend in paths having desired geometric configurations (e.g., shapes, sizes). As shown in FIG. 1, a first tier 113A may include a first portion 114A of the first routing structures 114; a second tier 113B vertically overlying the first tier 113A may include a second portion 114B of the first routing structures 114; and a third tier 113C vertically overlying the second tier 113B may include a third portion 114C of the first routing structures 114. In additional embodiments, the control logic region 102 may include a different quantity of the tiers 113 of the first routing structures 114, such as greater than three (3) tiers 113 of the first routing structures 114, or less than three (3) tiers 113 of the first routing structures 114.

The first routing structures 114 may each individually be formed of and include conductive material. By way of non-limiting example, the first routing structures 114 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 114 are formed of and include Cu. In additional embodiments, the first routing structures 114 are formed of and include W.

The first contact structures 116 (including the first group 116A and the second group 116B thereof) may each individually be formed of and include conductive material. By way of non-limiting example, the first routing structures 114 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 116 are formed of and include Cu. In additional embodiments, the first contact structures 116 are formed of and include W. In further embodiments, the first contact structures 116 of the first group 116A of the first contact structures 116 are formed of and include first conductive material (e.g., W); and the first contact structures 116 of the second group 116B of the first contact structures 116 are formed of and include a second, different conductive material (e.g., Cu).

As previously mentioned, portions of the semiconductive base structure 110 (e.g., conductively doped regions serving as source regions and drain regions, undoped regions serving as channel regions), the gate structures 112, the first routing structures 114, and the first contact structures 116 form various control logic devices 115 of the control logic region 102. In some embodiments, the control logic devices 115 comprise complementary metal oxide semiconductor (CMOS) circuitry. The control logic devices 115 may be configured to control various operations of other components (e.g., memory cells within the memory array region 104) of the microelectronic device 100. As a non-limiting example, the control logic devices 115 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, string drivers, page buffers, and various chip/deck control circuitry. As another non-limiting example, the control logic devices 115 may include devices configured to control column operations for arrays (e.g., memory element array(s), access device array(s)) within the memory array region 104 of the microelectronic device 100, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the control logic devices 115 may include devices configured to control row operations for arrays (e.g., memory element array(s), access device array(s)) within the memory array region 104 of the microelectronic device 100, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices.

Still referring to FIG. 1, the memory array region 104 of the microelectronic device 100 may include a stack structure 118, digit line structures 134 (e.g., bit line structures, data line structures), and a source tier 137 including one or more source structure(s) 138 and one or more contact pad(s) 140. The stack structure 118 may be vertically interposed between the digit line structures 134 and the source tier 137. The digit line structures 134 may vertically underlie (e.g., in the Z-direction) the stack structure 118, and may be coupled (e.g., electrically connected) to features (e.g., pillar structures, filled vias) within the stack structure 118, and additional features (e.g., contact structures) within the first interconnect region 106 of the microelectronic device 100. The source tier 137 may vertically overlie (e.g., in the Z-direction) the stack structure 118. The source structure(s) 138 and the contact pad(s) 140 of the source tier 137 may be coupled (e.g., electrically connected) to features (e.g., pillar structures, filled vias) within the stack structure 118 and additional features (e.g., additional contact structures) within the second interconnect region 108 of the microelectronic device 100.

The stack structure 118 of the memory array region 104 includes a vertically alternating (e.g., in the Z-direction) sequence of conductive structures 120 and insulative structures 122 arranged in tiers 124. Each of the tiers 124 of the stack structure 118 may include at least one of the conductive structures 120 vertically neighboring at least one of the insulative structures 122. In some embodiments, the conductive structures 120 are formed of and include tungsten (W) and the insulative structures 122 are formed of and include silicon dioxide ($SiO_2$). The conductive structures 120 and insulative structures 122 of the tiers 124 of the stack structure 118 may each individually be substantially planar, and may each individually exhibit a desired thickness.

As shown in FIG. 1, one or more deep contact structure(s) 126 may vertically extend through the stack structure 118. The deep contact structure(s) 126 may be configured and positioned to electrically connect one or more components of the microelectronic device 100 vertically overlying the stack structure 118 with one or more other components of the microelectronic device 100 vertically underlying the stack structure 118. The deep contact structure(s) 126 may be formed of and include conductive material. In some embodiments, the deep contact structure(s) are formed of and include W.

As shown in FIG. 1, the memory array region 104 further includes cell pillar structures 128 vertically extending through the stack structure 118. The cell pillar structures 128 may each individually include a semiconductive pillar (e.g., a polycrystalline silicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures 128 and the conductive structures 120 of the tiers 124 of the stack structure 118 may define vertically extending strings of memory cells 130 coupled in series with one another within the memory array region 104 of the microelectronic device 100. In some embodiments, the memory cells 130 formed at the intersections of the conductive structures 120 and the cell pillar structures 128 within the tiers 124 of the stack structure 118 comprise so-called "MONOS" (metal-oxide-nitride-oxide-semiconductor) memory cells. In additional embodiments, the memory cells 130 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 128 and the conductive structures 120 of the different tiers 124 of the stack structure 118.

With continued reference to FIG. 1, the digit line structures 134 may be vertically interposed between the stack structure 118 and the first interconnect region 106 underlying the stack structure 118. Individual digit line structures 134 may be coupled to individual vertically extending strings of memory cells 130. In some embodiments, the digit line structures 134 directly physically contact the cell pillar structures 128. In additional embodiments, conductive contact structures may vertically intervene between the digit line structures 134 and the cell pillar structures 128, and may couple the digit line structures 134 to the vertically extending strings of memory cells 130.

The digit line structures 134 may each individually be formed of and include conductive material. By way of non-limiting example, the digit line structures 134 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 134 are each individually formed of and include W.

As shown in FIG. 1, digit line cap structures 136 may directly vertically underlie the digit line structures 134. The digit line cap structures 136 may cover lower surfaces of the digit line structures 134. The digit line cap structures 136 may be formed of and include insulative material. By way of non-limiting example, the digit line cap structures 136 may each individually be formed of and include a dielectric nitride material, such as $SiN_y$ (e.g., $Si_3N_4$). As described in further detail below, conductive contact structures (e.g., digit line contact structures) may vertically extend through the digit line cap structures 136 and to the digit line structures 134 to couple the digit line structures 134 to additional features thereunder.

With continued reference to FIG. 1, the source tier 137 may be vertically interposed between the stack structure 118 and the second interconnect region 108 overlying the stack structure 118. Within the source tier 137, the source structure(s) 138 and the contact pad(s) 140 may horizontally neighbor one another (e.g., in the X-direction, in the Y-direction). The source structure(s) 138 may be electrically isolated from the contact pad(s) 140, and may be positioned at substantially the same vertical position (e.g., in the Z-direction) as the contact pad(s) 140. At least one insulative material may be horizontally interposed between the source structure(s) 138 and the contact pad(s) 140, as described in further detail below.

The source structure(s) 138 of the source tier 137 may be coupled to the vertically extending strings of memory cells 130. In some embodiments, the source structure(s) 138 directly physically contact the cell pillar structures 128. In additional embodiments, conductive contact structures may vertically intervene between the source structure(s) 138 and the cell pillar structures 128, and may couple the source structure(s) 138 to the vertically extending strings of memory cells 130. In addition, the source structure(s) 138 may be coupled to additional structures (e.g., contact structures, routing structures, pad structures) within the second interconnect region 108, as described in further detail below.

The contact pad(s) 140 of the source tier 137 may be coupled to the additional conductive features (e.g., conductive contact structures, conductive pillars, conductively filled vias) within the stack structure 118. For example, as shown in FIG. 1, the contact pad(s) 140 may be coupled to the deep contact structure(s) 126 vertically extending through the stack structure 118. In some embodiments, the contact pad(s) 140 directly physically contact the deep contact structure(s) 126. In additional embodiments, additional contact structures may vertically intervene between the contact pad(s) 140 and the deep contact structure(s) 126, and may couple the contact pad(s) 140 to the deep contact structure(s) 126. In addition, the contact pad(s) 140 may be coupled to additional structures (e.g., contact structures, routing structures, pad structures) within the second interconnect region 108, as described in further detail below.

The source structure(s) 138 and the contact pad(s) 140 may each be formed of and include conductive material. A material composition of the source structure(s) 138 may be substantially the same as a material composition of the contact pad(s) 140. In some embodiments, the source structure(s) 138 and the contact pad(s) 140 are formed of and include conductively doped semiconductive material, such as a conductively doped form of one or more of a silicon material, such as monocrystalline silicon or polycrystalline silicon; a silicon-germanium material; a germanium material; a gallium arsenide material; a gallium nitride material; and an indium phosphide material. As a non-limiting example, the source structure(s) 138 and the contact pad(s) 140 may be formed of and include epitaxial silicon (e.g., monocrystalline silicon formed through epitaxial growth) doped with at least one dopant (e.g., one or more of at least one n-type dopant, at least one p-type dopant, and at least another dopant). As another non-limiting example, the source structure(s) 138 and the contact pad(s) 140 may be formed of and include polycrystalline silicon doped with at least one dopant (e.g., one or more of at least one n-type dopant, at least one p-type dopant, and at least another dopant).

As shown in FIG. 1, optionally, strapping structures 141 may be located on or over the source structure(s) 138 and the contact pad(s) 140. The strapping structures 141 may be vertically interposed between the source structure(s) 138 and the contact pad(s) 140 and additional features (e.g., additional structures, additional materials) within the second interconnect region 108. If present, the strapping structures 141 may be formed of and include conductive material. A material composition of the strapping structures 141 may be selected to lower contact resistance (relative to configurations wherein the strapping structures 141 are absent) between conductive structures within the second interconnect region 108 and each of source structure(s) 138 and the contact pad(s) 140 of the source tier 137. By way of non-limiting example, the strapping structures 141 (if any) may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the strapping structures 141 are formed of and include tungsten silicide ($WSi_x$). In additional embodiments, the strapping structures 141 are formed of and include one or more of (e.g., a stack of) W and tungsten nitride ($WN_x$).

With continued reference to FIG. 1, the first interconnect region 106 of the microelectronic device 100 may be vertically interposed between the control logic region 102 and the memory array region 104 of the microelectronic device 100. The first interconnect region 106 may couple features of the control logic region 102 with features of the memory array region 104. As shown in FIG. 1, the first interconnect region 106 may include second contact structures 142 coupled to the first routing structures 114 of the control logic region 102, third contact structures 144 (e.g., digit line contact structures) coupled to the digit line structures 134 of the memory array region 104, and connected bond pads 146 extending between and coupling the second contact structures 142 and the third contact structures 144. The connected bond pads 146 may include first bond pads 148 on (e.g., vertically overlying and directly adjacent) the second contact structures 142, and second bond pads 150 on (e.g., vertically underlying and directly adjacent) the third contact structures 144. The first bond pads 148 and the second bond pads 150 may be physically connected to one another to form the connected bond pads 146.

The second contact structures 142 of the first interconnect region 106 may vertically extend from and between the first bond pads 148 and some of the first routing structures 114 of the control logic region 102. In some embodiments, the second contact structures 142 comprise conductively filled vias vertically extending through dielectric material interposed between the first bond pads 148 and the first routing structures 114. The second contact structures 142 may be formed of and include conductive material. By way of non-limiting example, the second contact structures 142 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second contact structures 142 is formed of and includes Cu.

The third contact structures 144 of the first interconnect region 106 may vertically extend from and between the second bond pads 150 and the digit line structures 134 of the memory array region 104. In some embodiments, the third contact structures 144 comprise additional conductively filled vias vertically extending from the digit line structures 134, through the digit line cap structures 136 and additional insulative material (described in further detail below), and to the second bond pads 150. The third contact structures 144 may be located at desired positions along lengths (e.g., in the Y-direction) of the digit line structures 134. The third contact structures 144 may be formed of and include conductive material. By way of non-limiting example, the third contact structures 144 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 144 are formed of and include Cu.

The connected bond pads 146 of the first interconnect region 106 may vertically extend from and between the second contact structures 142 and the third contact structures 144. The first bond pads 148 of the connected bond pads 146 may vertically extend from and between the second contact structures 142 and the second bond pads 150 of the connected bond pads 146; and the second bond pads 150 of the connected bond pads 146 may vertically extend from and between the third contact structures 144 and the first bond pads 148 of the connected bond pads 146. While in FIG. 1, the first bond pad 148 and the second bond pad 150 of each connected bond pad 146 are distinguished from one another by way of a dashed line, the first bond pad 148 and the second bond pad 150 may be integral and continuous with one another. Put another way, each connected bond pad 146 may be a substantially monolithic structure including the first bond pad 148 as a first region thereof, and the second bond pad 150 as a second region thereof. For each connected bond pad 146, the first bond pad 148 thereof may be attached to the second bond pad 150 thereof without a bond line.

The connected bond pads 146 (including the first bond pads 148 and the second bond pads 150 thereof) may be formed of and include conductive material. By way of non-limiting example, the connected bond pads 146 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the connected bond pads 146 (including the first bond pad 148 and the second bond pad 150 thereof) is formed of and includes Cu.

Still referring to FIG. 1, at least one insulative material 132 may cover and surround the second contact structures 142, the third contact structures 144, and the connected bond pads 146. The at least one insulative material 132 may also cover and surround portions of one or more of the digit line structures 134, the digit line cap structures 136, the first routing structures 114, and the first contact structures 116. In some embodiments, the insulative material 132 is formed of and includes at least one dielectric oxide material, such as $SiO_x$ (e.g., $SiO_2$). In additional embodiments, the insulative material 132 is formed of and includes at least one low-k dielectric material, such as one or more of $SiO_xC_y$, $SiO_xN_y$, $SiC_xO_yH_z$, and $SiO_xC_zN_y$. The insulative material 132 may be substantially homogeneous, or the insulative material 132 may be heterogeneous. As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If the insulative material 132 is heterogeneous, amounts of one or more elements included in the insulative material 132 may vary stepwise (e.g., change abruptly), or may vary continuously (e.g., change progressively, such as linearly, parabolically) throughout different portions of the insulative material 132. In some embodiments, the insulative material 132 is substantially homogeneous. In additional embodiments, the insulative material 132 is heterogeneous. The insulative material 132 may, for example, be formed of and include a stack of at least two different dielectric materials.

With continued reference to FIG. 1, the second interconnect region 108 of the microelectronic device 100 may vertically overlie the memory array region 104 of the microelectronic device 100. The second interconnect region 108 may include second routing structures 152 and conductive pads 156. The second routing structures 152 may vertically overlie the source tier 137 (including the source structure(s) 138 and the contact pad(s) 140 thereof) of the memory array region 104, and may be coupled to the source structure(s) 138 and the contact pad(s) 140 by way of fourth contact structures 154. The fourth contact structures 154 may extend between the second routing structures 152 and the source structure(s) 138 and the contact pad(s) 140 of the source tier 137. If present, the strapping structures 141 may vertically intervene between the fourth contact structures 154 and the source structure(s) 138 and the contact pad(s) 140. The conductive pads 156 may vertically overlie the second routing structures 152, and may be coupled to the second routing structures 152 by way of fifth contact structures 158. The fifth contact structures 158 may extend from and between the second routing structures 152 and the conductive pads 156.

The second routing structures 152 and the conductive pads 156 may serve as global routing structures for the microelectronic device 100. The second routing structures 152 and the conductive pads 156 may, for example, be configured to receive global signals from an external bus, and to relay the global signals to other components (e.g., structures, devices) of the microelectronic device 100.

The second routing structures 152, the fourth contact structures 154, the conductive pads 156, and the fifth contact structures 158 may each be formed of and include conductive material. By way of non-limiting example, the second routing structures 152, the fourth contact structures 154, the conductive pads 156, and the fifth contact structures 158 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 152 and the fourth contact structures 154 are each formed of and include Cu, the conductive pads 156 are formed of and include Al, and the fifth contact structures 158 are formed of and include W. In additional embodiments, the second routing structures 152 are formed of and include Cu, the conductive pads 156 are formed of and include Al, and the fourth contact structures 154 and the fifth contact structures 158 are each formed of and include W.

The second routing structures 152, the fourth contact structures 154, the conductive pads 156, and the fifth contact structures 158 may each individually have a desired vertical thickness (e.g., dimension in the Z-direction). Thicknesses of the second routing structures 152 and the conductive pads 156 may be selected at least partially based on the material compositions of the second routing structures 152 and the conductive pads 156 and functions of the second routing structures 152 and the conductive pads 156 within the microelectronic device 100. By way of non-limiting example, if the second routing structures 152 comprise Cu, a relatively greater vertical thickness may facilitate relatively lower electrical resistance, and a relatively smaller vertical thickness may facilitate one or more relatively lower electrical capacitance and relatively greater density. At least in embodiments wherein the second routing structures 152 comprise Cu and are employed receive and relay global signals within the microelectronic device 100, the second routing structures 152 may be formed to have relatively greater thicknesses, such as thicknesses within a range of from about 100 nanometers (nm) to about 5 micrometers (μm).

Still referring to FIG. 1, at least one additional insulative material 160 may cover and surround the second routing structures 152, the fourth contact structures 154, the conductive pads 156, and the fifth contact structures 158. The at least one additional insulative material 160 may also cover and surround portions of the source structure(s) 138 and the contact pad(s) 140. A material composition of the additional insulative material 160 may be substantially the same as or may be different than a material composition of the insulative material 132. In some embodiments, the additional insulative material 160 is formed of and includes at least one dielectric oxide material, such as $SiO_x$ (e.g., $SiO_2$). In additional embodiments, the additional insulative material 160 is formed of and includes at least one low-k dielectric material, such as one or more of $SiO_xC_y$, $SiO_xN_y$, $SiC_xO_yH_z$, and $SiO_xC_zN_y$. The additional insulative material 160 may be substantially homogeneous, or the additional insulative material 160 may be heterogeneous. If the additional insulative material 160 is heterogeneous, amounts of one or more elements included in the additional insulative material 160 may vary stepwise (e.g., change abruptly), or may vary continuously (e.g., change progressively, such as linearly, parabolically) throughout different portions of the additional insulative material 160. In some embodiments, the additional insulative material 160 is substantially homogeneous. In additional embodiments, the additional insulative material 160 is heterogeneous. The additional insulative material 160, for example, be formed of and include a stack of at least two different dielectric materials.

Thus, a microelectronic device according to embodiments of the disclosure comprises a memory array region, a control logic region underlying the memory array region, and an interconnect region vertically interposed between the memory array region and the control logic region. The memory array region comprises a stack structure comprising vertically alternating conductive structures and insulating structures; vertically extending strings of memory cells within the stack structure; at least one source structure vertically overlying the stack structure and coupled to the vertically extending strings of memory cells; and digit line structures vertically underlying the stack structure and coupled to the vertically extending strings of memory cells. The control logic region comprises control logic devices configured to effectuate a portion of control operations for the vertically extending strings of memory cells. The interconnect region comprises structures coupling the digit line structures of the memory array region to the control logic devices of the control logic region.

Furthermore, a memory device according to embodiments of the disclosure comprises a memory array region, a first interconnect region vertically underlying the memory array region, a control logic region vertically underlying the first interconnect region, and a second interconnect region vertically overlying the memory array region. The memory array region comprises a stack structure, strings of memory cells, one or more source structures, and data line structures. The stack structure comprises a vertically alternating sequence of conductive structures and insulating structures. The strings of memory cells vertically extend through the stack structure. The one or more source structures vertically overlie the stack structure and are coupled to the strings of memory cells. The data line structures vertically underlie the stack structure and are coupled to the strings of memory cells. The first interconnect region comprises conductive pad structures coupled to the data line structures. The control logic region comprises complementary metal oxide semiconductor (CMOS) circuitry including conductive routing structures coupled to the conductive pad structures. The second interconnect region comprises additional conductive routing structures coupled to the one or more source structures.

FIGS. 2A through 2D are simplified, partial cross-sectional views illustrating embodiments of a method of forming the microelectronic device 100 of FIG. 1. With the description provided below, it will be readily apparent to one of ordinary skill in the art that the methods and structures described herein may be used in various devices and electronic systems.

Figure 2A:
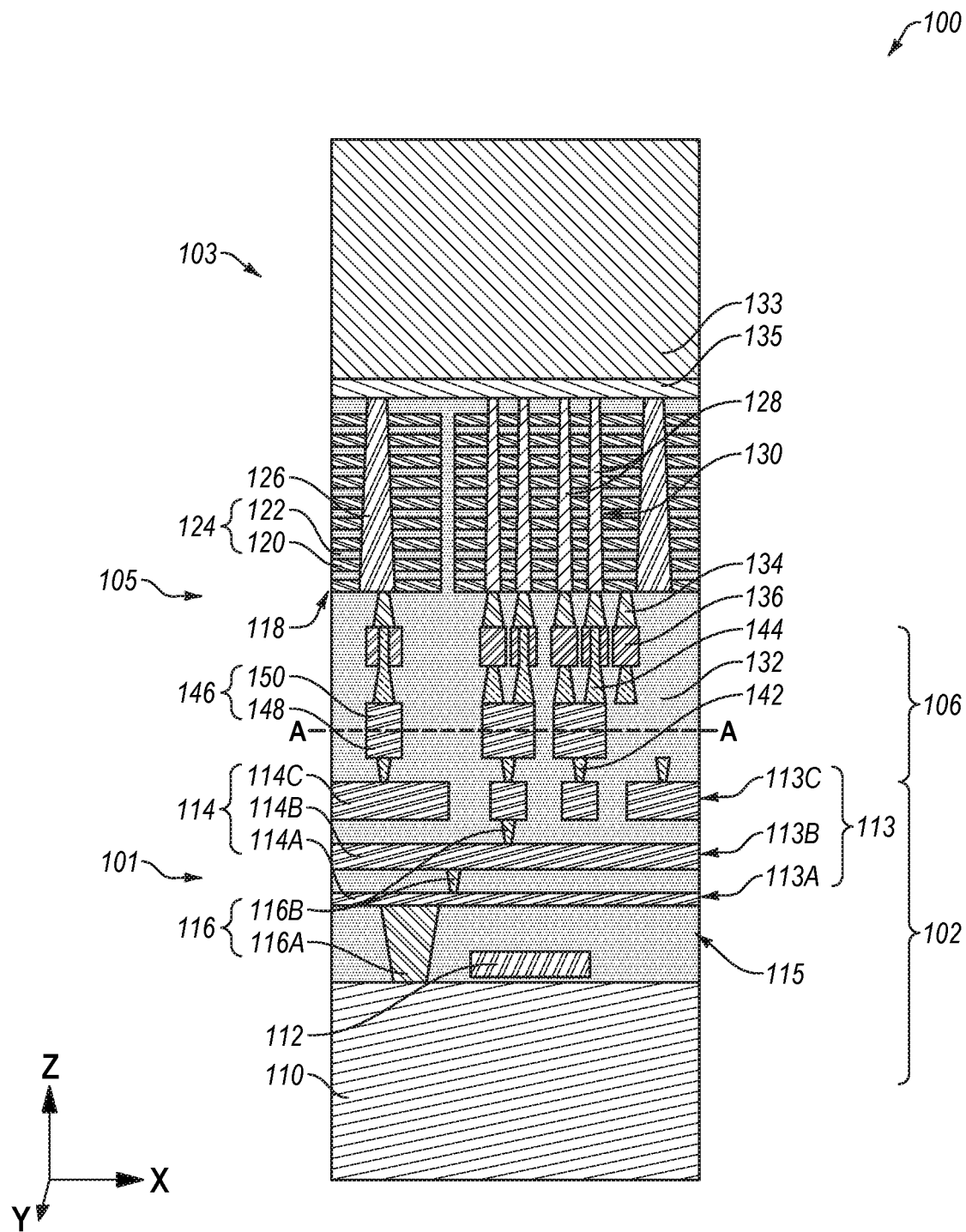
FIGS. 2A through 2D are simplified, partial cross-sectional views illustrating a method of forming the microelectronic device of shown in FIG. 1, in accordance with embodiments of the disclosure.

Referring to FIG. 2A, a first microelectronic device structure 101 (e.g., a first die) may be attached (e.g., bonded) to a second microelectronic device structure 103 to form a microelectronic device structure assembly 105. In FIG. 2A, the vertical boundaries of the first microelectronic device structure 101 relative to the second microelectronic device structure 103 prior to the attachment of the first microelectronic device structure 101 to the second microelectronic device structure 103 to form the microelectronic device structure assembly 105 are depicted by the dashed line A-A. The first microelectronic device structure 101 may be attached to the second microelectronic device structure 103 without a bond line.

As shown in FIG. 2A, the first microelectronic device structure 101 may be formed to include the control logic region 102 of the microelectronic device 100 (FIG. 1), including the semiconductive base structure 110, the gate structures 112, the first routing structures 114, and the first contact structures 116 thereof. The first microelectronic device structure 101 may also be formed to include the second contact structures 142, the first bond pads 148, and a portion of the insulative material 132 (e.g., a portion at least covering and surrounding the second contact structures 142 and the first bond pads 148). The first microelectronic device structure 101 may be formed using conventional processes (e.g., conventional material deposition processes, conventional material removal processes) and conventional processing equipment, which are not described in detail herein.

Still referring to FIG. 2A, the second microelectronic device structure 103 may be formed to include a carrier structure 133 (e.g., a carrier wafer); a doped semiconductive material 135 on or over the carrier structure 133; and a remainder of the memory array region 104 (FIG. 1) of the microelectronic device 100 (FIG. 1) to be formed, including the stack structure 118, the deep contact structure(s) 126, the cell pillar structures 128, and the digit line structures 134. In addition, the second microelectronic device structure 103 may also be formed to include the digit line cap structures 136, the third contact structures 144, the second bond pads 150, and an additional portion of the insulative material 132 (e.g., an additional portion at least covering and surrounding the third contact structures 144 and the second bond pads 150).

The carrier structure 133 of the second microelectronic device structure 103 comprises a base material or construction upon which additional features (e.g., materials, structures, devices) of the second microelectronic device structure 103 are formed. The carrier structure 133 may, for example, be formed of and include one or more of semiconductive material (e.g., one or more of a silicon material, such as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). The carrier structure 133 may be configured to facilitate safe handling of the second microelectronic device structure 103 for attachment to the first microelectronic device structure 101.

In some embodiments, the doped semiconductive material 135 (e.g., conductively doped silicon, such as one or more conductively doped monocrystalline silicon and conductively doped polycrystalline silicon) is formed on or over the carrier structure 133, and then the stack structure 118 (including the tiers 124 of the conductive structures 120 and the insulative structures 122 there) is formed on or over the doped semiconductive material 135. The deep contact structure(s) 126, the cell pillar structures 128, and additional features (e.g., filled trenches, contact regions, additional contact structures) may then be formed within the stack structure 118. Thereafter, the additional portion of the insulative material 132, the digit line structures 134, the digit line cap structures 136, the third contact structures 144, and the second bond pads 150 may be formed (e.g., sequentially formed) on or over the stack structure 118. The second microelectronic device structure 103 may be formed separate from the first microelectronic device structure 101.

Following the formation of the first microelectronic device structure 101 and the separate formation of the second microelectronic device structure 103, the second microelectronic device structure 103 may be vertically inverted (e.g., flipped upside down in the Z-direction) and attached (e.g., bonded) to the first microelectronic device structure 101 to form the microelectronic device structure assembly 105. Alternatively, the first microelectronic device structure 101 may be vertically inverted (e.g., flipped upside down in the Z-direction) and attached to the second microelectronic device structure 103 to form the microelectronic device structure assembly 105. The attachment of the second microelectronic device structure 103 to the first microelectronic device structure 101 may attach the second bond pads 150 of the second microelectronic device structure 103 to the first bond pads 148 of the first microelectronic device structure 101 to form the connected bond pads 146. In addition, the attachment of the second microelectronic device structure 103 to the first microelectronic device structure 101 may also attach the additional portion of the insulative material 132 included in the second microelectronic device structure 103 with the portion of the insulative material 132 included in the first microelectronic device structure 101.

Figure 2B:
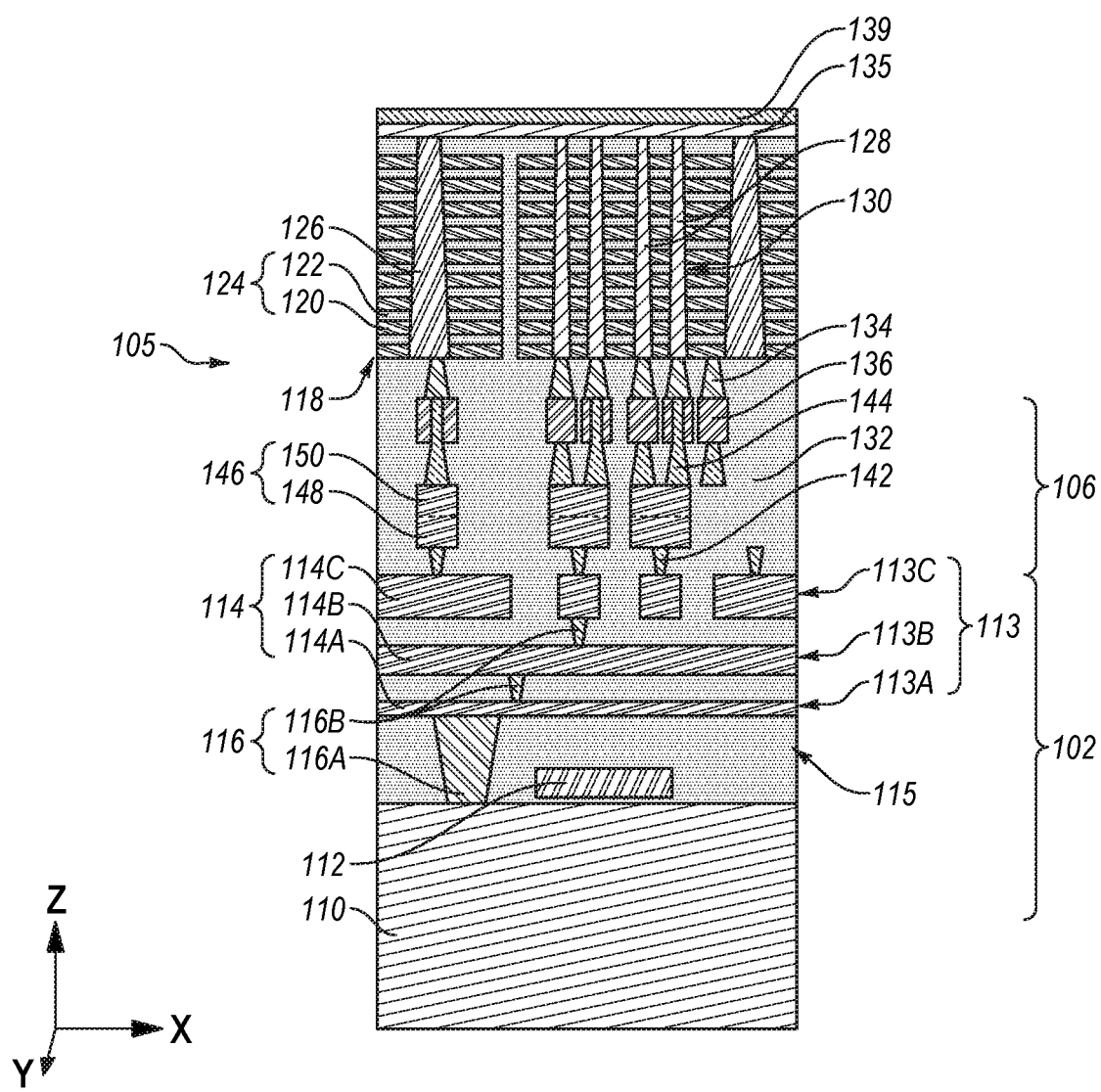

Referring next to FIG. 2B, after attaching the second microelectronic device structure 103 (FIG. 2A) to the first microelectronic device structure 101 (FIG. 2A), the carrier structure 133 (FIG. 2A) may be removed (e.g., through conventional detachment processes and/or conventional grinding processes) from the microelectronic device structure assembly 105 to expose (e.g., uncover) the doped semiconductive material 135. Optionally, an additional amount (e.g., additional volume) of doped semiconductive material (e.g., doped polycrystalline silicon) may be formed on doped semiconductive material 135 following the removal of the carrier structure 133 (FIG. 2A). If formed, the additional amount of doped semiconductive material may have substantially the same material composition as that of the doped semiconductive material 135, or may have a different material composition than that of the doped semiconductive material 135. In addition, optionally, a strapping material 139 may formed on or over the doped semiconductive material 135. The strapping material 139 (if any) may comprise one or more of the conductive materials previously described in relation to the strapping structures 141 (FIG. 1). The doped semiconductive material 135 (and the additional amount of doped semiconductive material, if any) may, optionally, be annealed (e.g., thermally annealed) before and/or after the formation of the strapping material 139 (if any). Annealing the doped semiconductive material 135 may, for example, facilitate or enhance dopant activation within the doped semiconductive material 135.

Figure 2C:
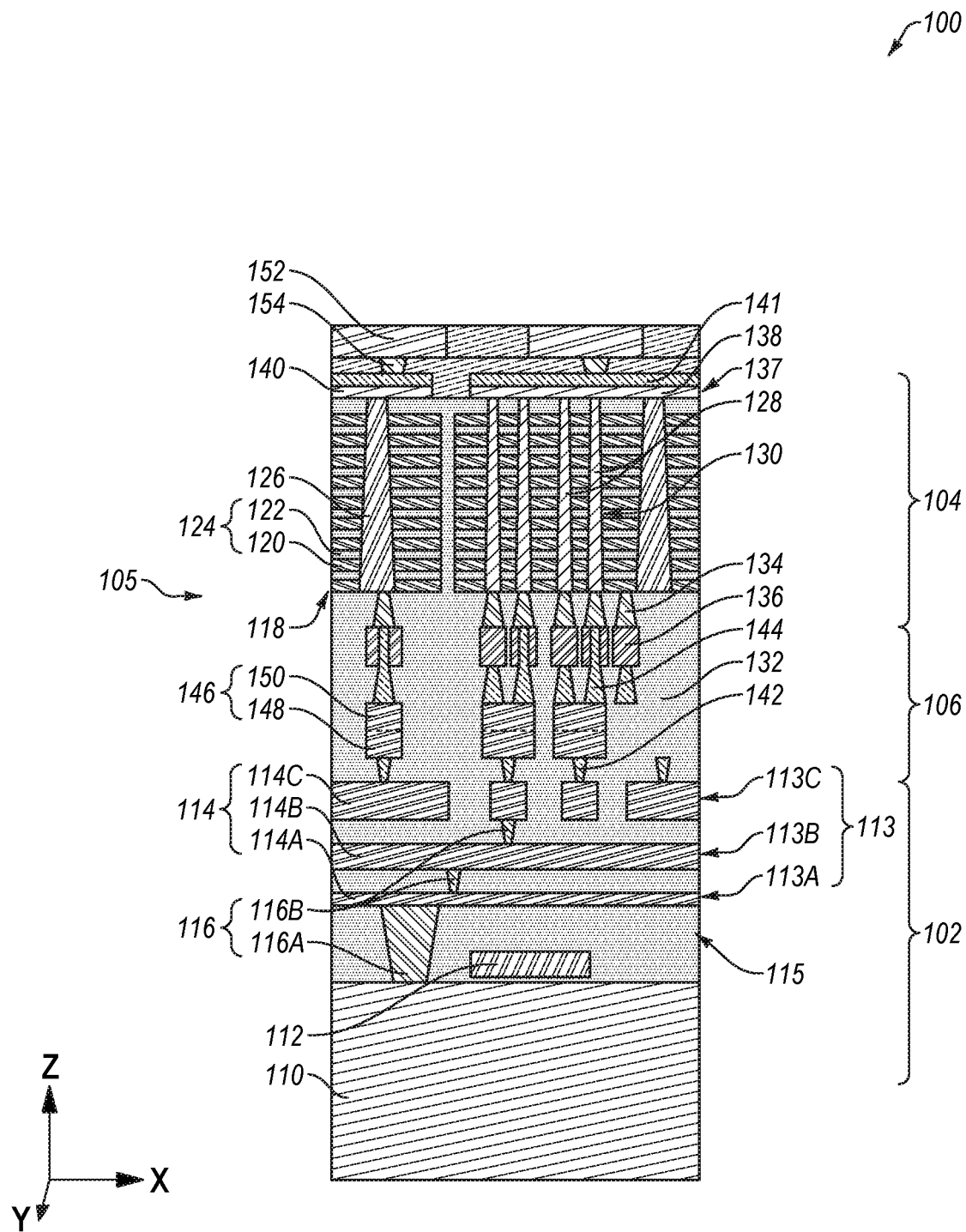

Referring next to FIG. 2C, portions of the doped semiconductive material 135 (FIG. 2B) (and the additional amount of doped semiconductive material, if any) and the strapping material 139 (FIG. 2B) (if any) may be removed (e.g., etched) to respectively form the source structure(s) 138, the contact pad(s) 140, and the strapping structures 141 (if any) previously described herein with reference to FIG. 1. The fourth contact structures 154 may then be formed on or over the source structure(s) 138 and the contact pad(s) 140, and the second routing structures 152 may then be formed on or over the fourth contact structures 154.

The processing acts described above with respect to FIGS. 2A through 2C effectuate the formation of the source structure(s) 138, the contact pad(s) 140, and the strapping structures 141 (if any) after (e.g., subsequent to, following) the formation of other features (e.g., the stack structure 118, the deep contact structure(s) 126, the cell pillar structures 128, the digit line cap structures 136, the digit line structures 134) of the memory array region 104 of the microelectronic device 100 (FIG. 1), and after the attachment of the second microelectronic device structure 103 (FIG. 2A) to the first microelectronic device structure 101 (FIG. 2A).

In additional embodiments, the source structure(s) 138, the contact pad(s) 140, and the strapping structures 141 (if any) are formed prior to the formation of other features of the memory array region 104 of the microelectronic device 100 (FIG. 1), and prior to the attachment of the second microelectronic device structure 103 (FIG. 2A) to the first microelectronic device structure 101 (FIG. 2A). By way of non-limiting example, the strapping material 139 (FIG. 2B) (if any) may be formed on or over the carrier structure 133 (FIG. 2A), and then the doped semiconductive material 135 (FIG. 2B) may be formed on or over the strapping material 139 (FIG. 2B, if any, or on the carrier structure 133 if the strapping material 139 is omitted). Portions of the strapping material 139 (FIG. 2B, if any) and the doped semiconductive material 135 (FIG. 2B) may then be removed to form the strapping structures 141 (FIG. 2C, if any) on or over the carrier structure 133 (FIG. 2A), and the source structure(s) 138 (FIG. 2C) and the contact pad(s) 140 on or over the strapping structures 141 (FIG. 2C, if any, or on the carrier structure 133). Thereafter, other features of the memory array region 104 (e.g., the stack structure 118, the deep contact structure(s) 126, the cell pillar structures 128, the digit line structures 134), the digit line cap structures 136, the third contact structures 144, and the second bond pads 150 may be formed on or over the source structure(s) 138 (FIG. 2C) and the contact pad(s) 140 (FIG. 2C) to form a modified version of the second microelectronic device structure 103 (FIG. 2A). The modified version of the second microelectronic device structure 103 may then be vertically inverted (e.g., flipped upside down in the Z-direction) and attached to the first microelectronic device structure 101 (FIG. 2A) to form a modified version of the microelectronic device structure assembly 105 (FIG. 2A). Thereafter, the carrier structure 133 may be removed to expose (e.g., uncover) the strapping structures 141 (FIG. 2C) (if any, or the source structure(s) 138 and the contact pad(s) 140 if the strapping structures 141 are absent). The fourth contact structures 154 may then be formed on or over the strapping structures 141 (if any), and the second routing structures 152 may be formed on or over the fourth contact structures 154 to arrive at the configuration of the microelectronic device structure assembly 105 shown in FIG. 2C.

Figure 2D:
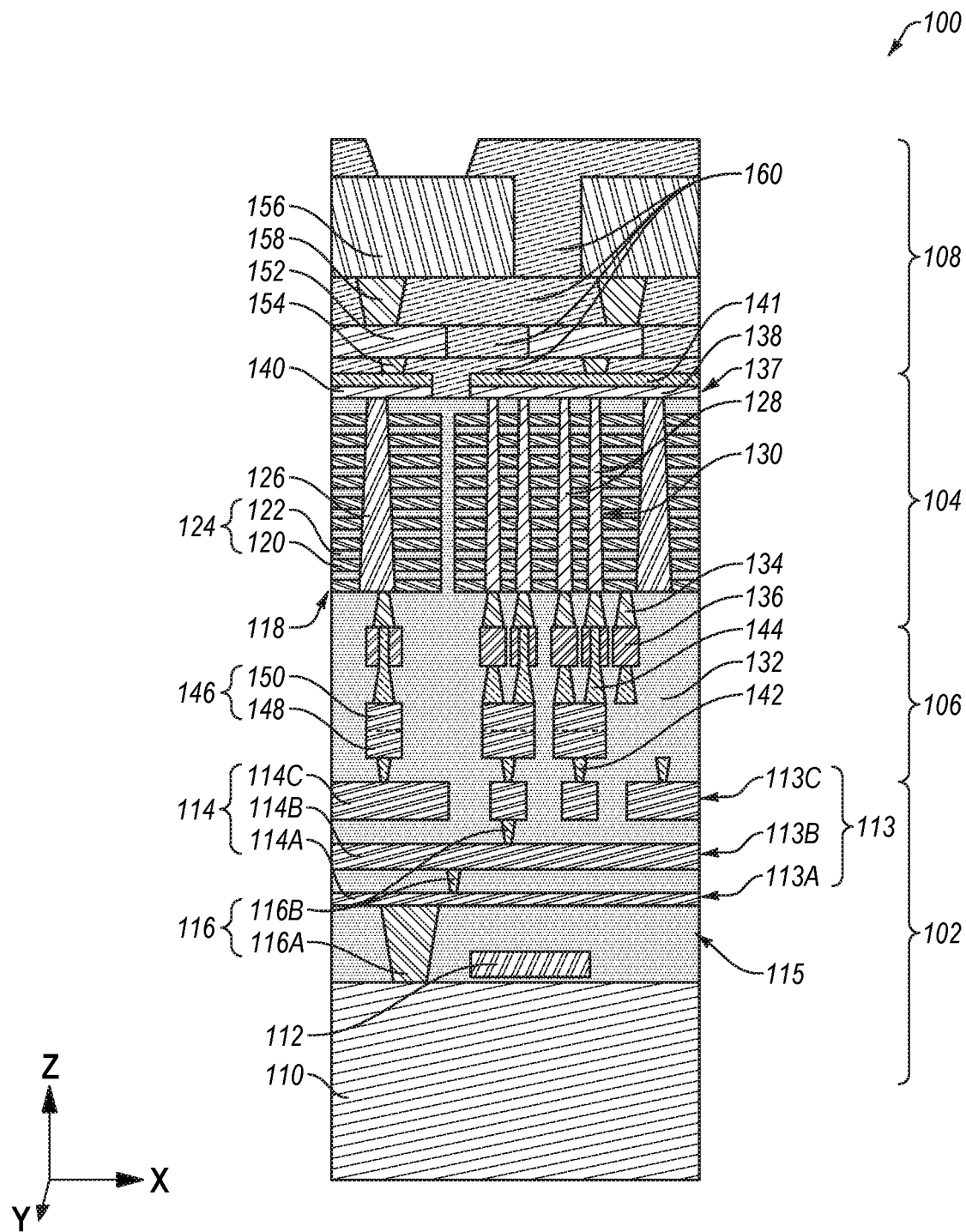

Referring next to FIG. 2D, the fifth contact structures 158 may be formed on or over the second routing structures 152, and the conductive pads 156 may be formed on or over the fifth contact structures 158 to effectuate the formation of the microelectronic device 100 previously described with reference to FIG. 1.

The method described above with reference to FIGS. 2A through 2D resolves limitations on control logic device configurations and associated microelectronic device performance (e.g., speed, data transfer rates, power consumption) that may otherwise result from thermal budget constraints imposed by the formation and/or processing of arrays (e.g., memory cell arrays, memory element arrays, access device arrays) of the microelectronic device. For example, by forming the first microelectronic device structure 101 (FIG. 2A) separate from the second microelectronic device structure 103 (FIG. 2A), configurations of the control logic devices 115 within the control logic region 102 of the first microelectronic device structure 101 (FIG. 2A) are not limited by the processing conditions (e.g., temperatures, pressures, materials) required to form components (e.g., memory cells, memory elements, access devices) of the memory array region 104 of the second microelectronic device structure 103 (FIG. 2A), and vice versa. In addition, forming the features (e.g., structures, materials, openings) of the memory array region 104 over the carrier structure 133 (FIGS. 2A and 2B) of the second microelectronic device structure 103 (FIG. 2A) may impede undesirable out-of-plane deformations (e.g., curvature, warping, bending, bowing, dishing) of components (e.g., the tiers 124 of the stack structure 118) that may otherwise occur during the various deposition, patterning, doping, etching, and annealing processes utilized to form different components of at least the memory array region 104.

Thus, in accordance with embodiments of the disclosure, a method of forming a microelectronic device comprises forming a first microelectronic device structure comprising control logic devices. A second microelectronic device structure is formed to comprise a carrier structure; a stack structure overlying the carrier structure and comprising vertically alternating conductive structures and insulating structures; vertically extending strings of memory cells within the stack structure; and digit line structures overlying the stack structure. The second microelectronic device structure is attached to the first microelectronic device structure to form a microelectronic device structure assembly. Within the microelectronic device structure assembly the digit line structures are vertically interposed between the stack structure and the control logic devices. The carrier structure is removed from the microelectronic device structure assembly. At least one source structure is formed over the stack structure of the microelectronic device structure assembly.

In additional embodiments, the microelectronic device 100 is formed to have a different configuration than that shown in FIG. 1. By way of non-limiting example, FIGS. 3 through 6 are simplified, partial cross-sectional view s of additional microelectronic device configurations, in accordance with additional embodiments of the disclosure. To avoid repetition, not all features (e.g., structures, materials, regions, devices) shown in FIGS. 3 through 6 are described in detail herein. Rather, unless described otherwise below, in FIGS. 3 through 6, a feature designated by a reference numeral that is a 100 increment of the reference numeral of a feature previously described with reference to FIG. 1 will be understood to be substantially similar to the previously described feature.

Figure 3:
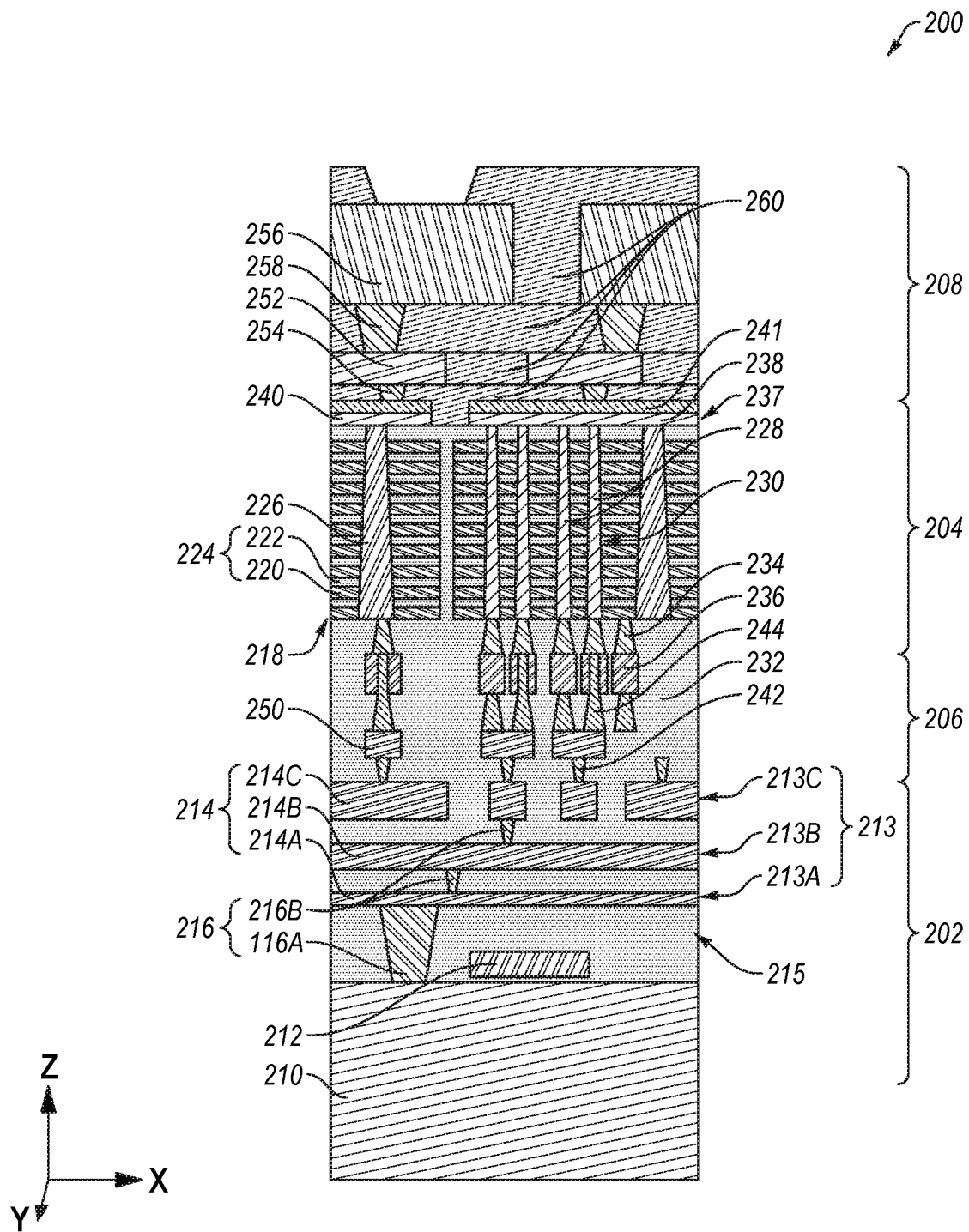
FIG. 3 is simplified, partial cross-sectional view of a microelectronic device, in accordance with additional embodiments of the disclosure.

FIG. 3 is a simplified, partial cross-sectional view of a microelectronic device 200 (e.g., a memory device, such as a 3D NAND Flash memory device), in accordance with an additional embodiment of the disclosure. As shown in FIG. 3, the microelectronic device 200 may be similar to the microelectronic device 100 previously described with reference to FIG. 1, except that within the first interconnect region 206, the second bond pads 250 are directly attached (e.g., directly bonded) to the second contact structures 242. Put another way, the second bond pads 250 are not portions of relatively larger, connected pads (e.g., analogous to the connected bond pads 146 previously described with reference to FIG. 1) also including first bond pads (e.g., analogous to the first bond pads 148 previously described with reference to FIG. 1) vertically intervening between the second bond pads 250 and the second contact structures 242. Instead, first bond pads analogous to (e.g., corresponding to) the first bond pads 148 previously described with reference to FIG. 1 may be omitted (e.g., absent) from the microelectronic device 200, such that the second bond pads 250 are directly attached to the second contact structures 242.

A vertical dimension (e.g., height in the Z-direction) of the first interconnect region 206 of the microelectronic device 200 may be relatively smaller than the vertical dimension (e.g., height in the Z-direction) of the first interconnect region 106 (FIG. 1) of the microelectronic device 100 (FIG. 1) at least partially due to the relatively smaller vertical dimensions of the second bond pads 250 as compared to the vertical dimensions of the connected bond pads 146 (FIG. 1) (which include the first bond pads 148 and the second bond pads 150 in combination). In addition, an overall vertical dimension of the microelectronic device 200 may be relatively smaller than an overall vertical dimension of the microelectronic device 100 (FIG. 1) at least partially due to the relatively smaller vertical dimension of the first interconnect region 206 as compared to the first interconnect region 106 (FIG. 1).

The microelectronic device 200 may be formed using processes similar to those previously described with reference to FIGS. 2A through 2D for the formation of the microelectronic device 100, except that first bond pads analogous to the first bond pads 148 (FIGS. 1 and 2A) may be omitted (e.g., absent) from a first microelectronic device structure analogous to the first microelectronic device structure 101 (FIG. 2A). As a result, during the formation of the microelectronic device 200, the second contact structures 242 of the first microelectronic device structure analogous to the first microelectronic device structure 101 (FIG. 2A) may be directly attached (e.g., directly bonded) to the second bond pads 250 of a second microelectronic device structure analogous to the second microelectronic device structure 103 (FIG. 2A).

Figure 4:
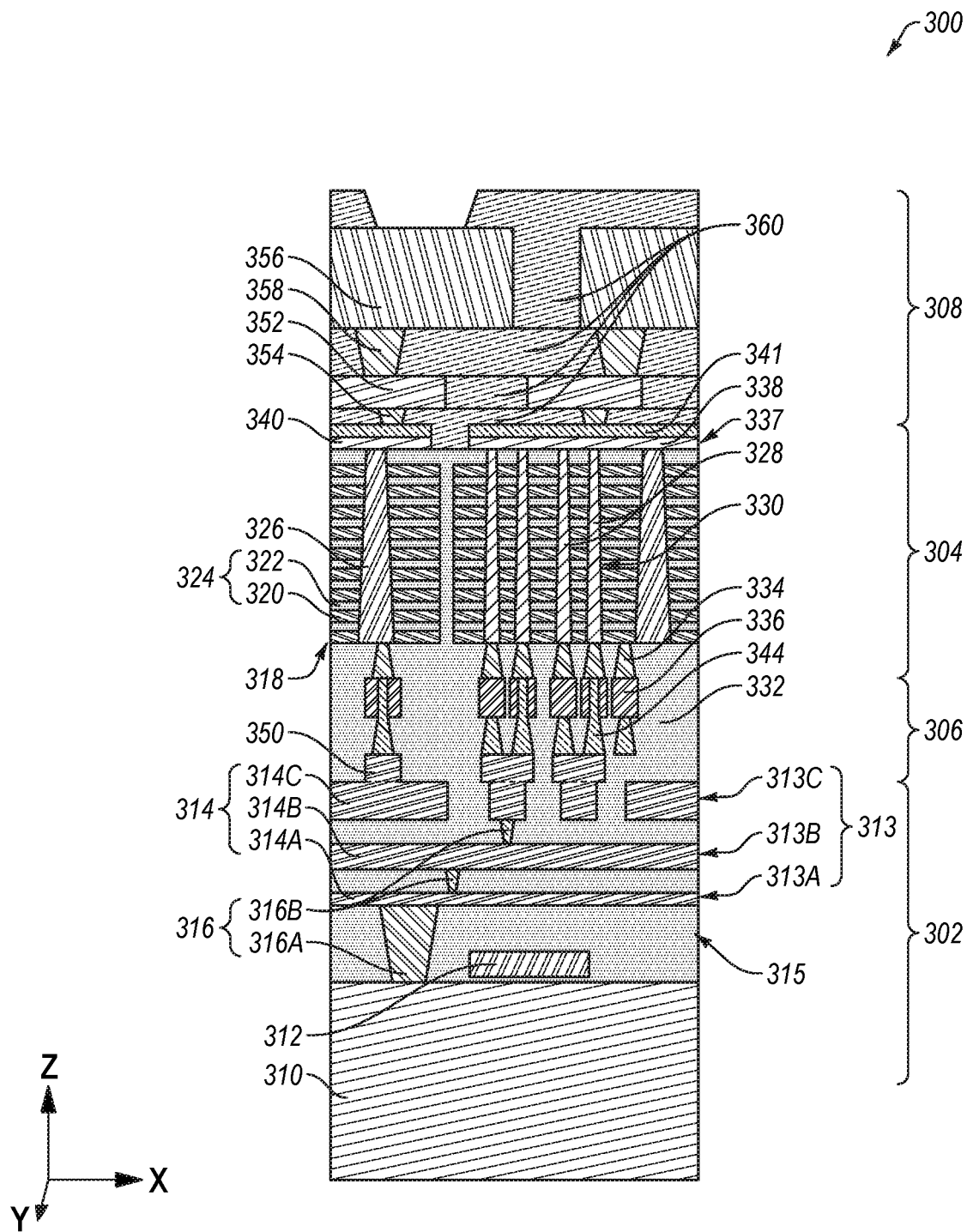
FIG. 4 is simplified, partial cross-sectional view of a microelectronic device, in accordance with further embodiments of the disclosure.

FIG. 4 is a simplified, partial cross-sectional view of a microelectronic device 300 (e.g., a memory device, such as a 3D NAND Flash memory device), in accordance with an additional embodiment of the disclosure. As shown in FIG. 4, the microelectronic device 300 may be similar to the microelectronic device 100 previously described with reference to FIG. 1, except that within the first interconnect region 306, the second bond pads 350 may be directly attached to some of the first routing structures 314 of the control logic region 302 of the microelectronic device 300. Put another way, second contact structures analogous to (e.g., corresponding to) the second contact structures 142 (FIG. 1) and first bond pads analogous to the first bond pads 148 (FIG. 1) may be omitted (e.g., absent) from the first interconnect region 306 of the microelectronic device 300. As shown in FIG. 4, in some embodiments, the second bond pads 350 are directly attached to the third portion 314C of the first routing structures 314 within the third tier 313C of the first routing structures 314. The third portion 314C of the first routing structures 314 of the control logic region 302 may effectively function as both routing structures (e.g., local routing structures) and bond pads. A configuration of the third portion 314C of the first routing structures 314 may be modified relative to a configuration of the third portion 114C (FIG. 1) of the first routing structures 114 (FIG. 1) to facilitate the bond pad functionality of the third portion 314C of the first routing structures 314. For example, the third portion 314C of the first routing structures 314 may include additional regions (e.g., additional horizontal regions) and/or different horizontal path configurations than the third portion 114C (FIG. 1) of the first routing structures 114 (FIG. 1).

A vertical dimension (e.g., height in the Z-direction) of the first interconnect region 306 of the microelectronic device 300 may be relatively smaller than the vertical dimension (e.g., height in the Z-direction) of the first interconnect region 106 (FIG. 1) of the microelectronic device 100 (FIG. 1) at least partially due to the relatively smaller vertical dimensions of the second bond pads 350 as compared to the combined vertical dimensions of the connected bond pads 146 (FIG. 1) and the second contact structures 142 (FIG. 1). A vertical dimension of the first interconnect region 306 of the microelectronic device 300 may also be relatively smaller than the vertical dimension of the first interconnect region 206 (FIG. 3) of the microelectronic device 200 (FIG. 3) at least partially due to the relatively smaller vertical dimensions of the second bond pads 350 as compared to the combined vertical dimensions of the second bond pads 250 (FIG. 3) and the second contact structures 242 (FIG. 3). In addition, an overall vertical dimension of the microelectronic device 300 may be relatively smaller than overall vertical dimensions of the microelectronic device 100 (FIG. 1) and the microelectronic device 100 (FIG. 3) at least partially due to the relatively smaller vertical dimension of the first interconnect region 306 as compared to the first interconnect region 106 (FIG. 1) and the first interconnect region 206 (FIG. 3).

The microelectronic device 300 may be formed using processes similar to those previously described with reference to FIGS. 2A through 2D for the formation of the microelectronic device 100, except that second contact structures analogous to the second contact structures 142 (FIGS. 1 and 2A) and first bond pads analogous to the first bond pads 148 (FIGS. 1 and 2A) may each be omitted (e.g., absent) from the equivalent of the first microelectronic device structure 101 (FIG. 2A). As a result, during the formation of the microelectronic device 300, some of the first routing structures 314 (e.g., the third portion 314C of the first routing structures 314 within the third tier 313C) of a first microelectronic device structure analogous to the first microelectronic device structure 101 (FIG. 2A) may be directly attached (e.g., directly bonded) to the second bond pads 350 of a second microelectronic device structure analogous to the second microelectronic device structure 103 (FIG. 2A).

Figure 5:
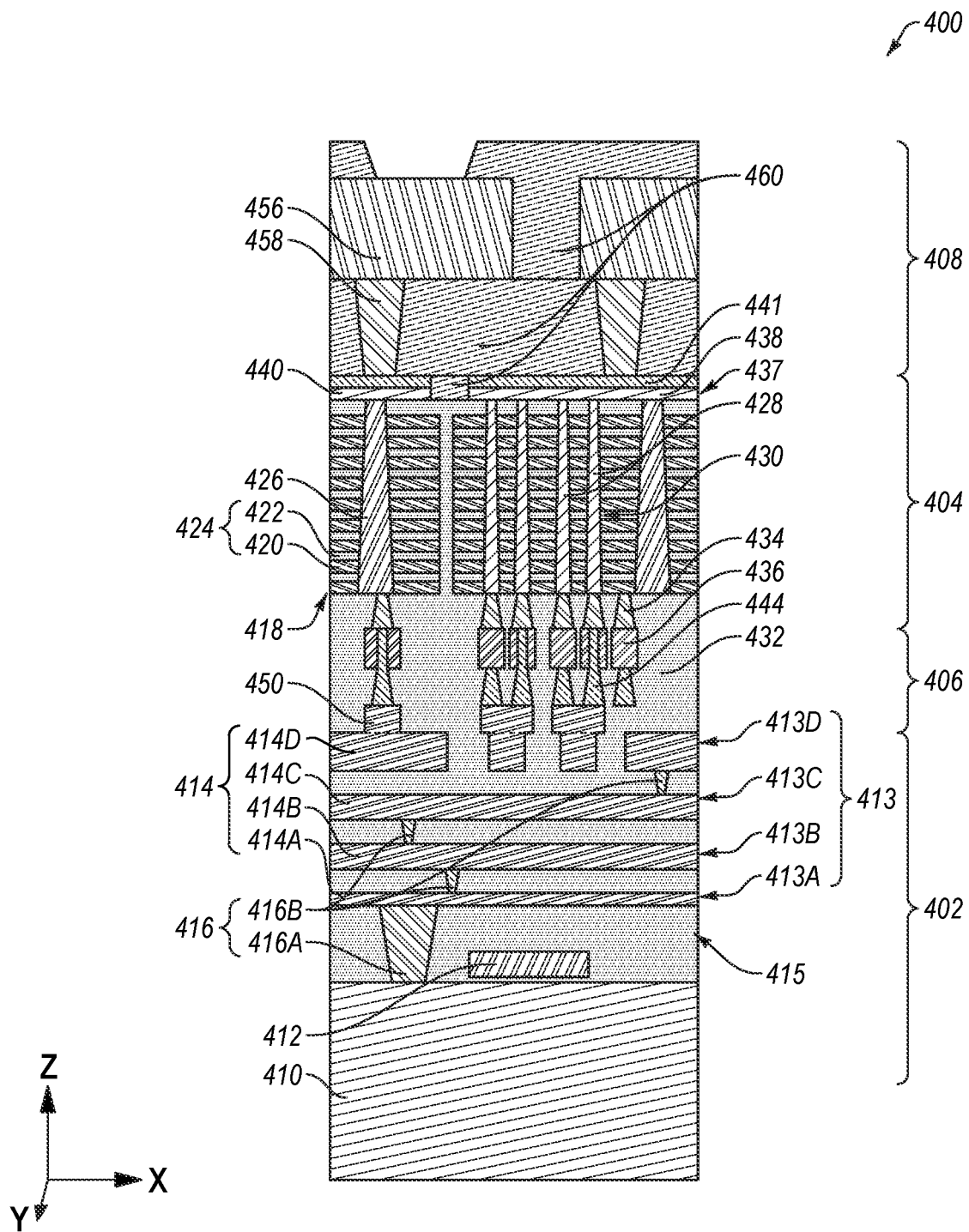
FIG. 5 is simplified, partial cross-sectional view of a microelectronic device, in accordance with yet additional embodiments of the disclosure.

FIG. 5 is a simplified, partial cross-sectional view of a microelectronic device 400 (e.g., a memory device, such as a 3D NAND Flash memory device), in accordance with an additional embodiment of the disclosure. As shown in FIG. 5, the microelectronic device 400 may be similar to the microelectronic device 100 previously described with reference to FIG. 1, except that the fifth contact structures 458 of the second interconnect region 408 may be directly attached (e.g., directly bonded) to the strapping structures 441 (if any, or the source structure(s) 438 and the contact pad(s) 440 if the strapping structures 441 are omitted); the control logic region 402 may include a fourth portion 414D of the first routing structures 414 in a fourth tier 413D vertically overlying the third tier 413C; and the second bond pads 450 of the first interconnect region 406 may be directly attached to the fourth portion 414D of the first routing structures 414. As shown in FIG. 5, second routing structures analogous to the second routing structures 152 (FIG. 1) and fourth contact structures analogous to the fourth contact structures 154 (FIG. 1) may each be omitted (e.g., absent) from the second interconnect region 408 of the microelectronic device 400. As described in further detail below, functions (e.g., global routing functions) of the second routing structures 152 (FIG. 1) may, instead, be effectuated by one or more of the portions (e.g., the fourth portion 414D) of the first routing structures 414 in one or more of the tiers 413 (e.g., the fourth tier 413D) of the first routing structures 414. In addition, second contact structures analogous to the second contact structures 142 (FIG. 1) and first bond pads analogous to the first bond pads 148 (FIG. 1) may each be omitted (e.g., absent) from the first interconnect region 406 of the microelectronic device 400.

Still referring to FIG. 5, the first routing structures 414 may be configured such that some of the first routing structures 414 are configured to receive global signals from an external bus, and to relay the global signals to other components (e.g., structures, devices) of the microelectronic device 400; and some other of the first routing structures 414 are configured to receive local signals, and to relay the local signals to other components (e.g., structures, devices) of the microelectronic device 400. Global signal paths within the tiers 413 of the first routing structures 414 may be separate from local signal paths within the tiers 413 of the first routing structures 414. In some embodiments, at least some of the fourth portion 414D of the first routing structures 414 within the fourth tier 413D of the first routing structures 414 are configured and operated to receive and relay global signals. Other portions (e.g., the first portion 414A, the second portion 414B, the third portion 414C) of the first routing structures 414 within other of the tiers 413 (e.g., the first tier 413A, the second tier 413B, the third tier 413C) of the first routing structures 414 may be configured and operated to receive and relay local signals.

With continued reference to FIG. 5, some of the first routing structures 414 of the control logic region 402 may effectively function as both routing structures and bond pads. For example, some of the first routing structures 414 within the fourth tier 413D of the first routing structures 414 may effectively function as both routing structures and bond pads. In additional embodiments, contact structures (e.g., conductively filled vias) vertically extend between and couple the second bond pads 450 and the fourth portion 414D of the first routing structures 414 within the fourth tier 413D of the first routing structures 414. The second bond pads 450 may, for example, be directly attached (e.g., directly bonded) to the contact structures in a manner substantially similar to that previously described herein with respect to the direct attachment of the second bond pads 250 (FIG. 3) to the second contact structures 242 (FIG. 3).

A vertical dimension (e.g., height in the Z-direction) of the control logic region 402 of the microelectronic device 300 may be relatively larger than the vertical dimension (e.g., height in the Z-direction) of the first interconnect region 106 (FIG. 1) of the microelectronic device 100 (FIG. 1); and vertical dimensions of the first interconnect region 406 of the microelectronic device 400 and the second interconnect region 408 of the microelectronic device 400 may respectively be relatively smaller than the vertical dimensions of the first interconnect region 106 (FIG. 1) of the microelectronic device 100 (FIG. 1) and the second interconnect region 108 (FIG. 1) of the microelectronic device 100 (FIG. 1). In addition, an overall vertical dimension of the microelectronic device 400 may be relatively smaller than an overall vertical dimension of the microelectronic device 100 (FIG. 1) at least partially due to the relatively smaller vertical dimensions of the first interconnect region 406 and the second interconnect region 408 as compared to the first interconnect region 106 (FIG. 1) and the second interconnect region 108 (FIG. 1), respectively.

The microelectronic device 400 may be formed using processes similar to those previously described with reference to FIGS. 2A through 2D for the formation of the microelectronic device 100, except that a first microelectronic device structure analogous to the first microelectronic device structure 101 may be formed to include the fourth tier 413D of the first routing structures 414 (wherein at least some of the fourth portion 414D of the first routing structures 414 within the fourth tier 413D of the first routing structures 414 may be configured and operated to receive and relay global signals); second contact structures analogous to the second contact structures 142 (FIGS. 1 and 2A) and first bond pads analogous to the first bond pads 148 (FIGS. 1 and 2A) may each be omitted (e.g., absent) from the first microelectronic device structure analogous to the first microelectronic device structure 101 (FIG. 2A); and second routing structures analogous to the second routing structures 152 (FIGS. 1 and 2A) and fourth contact structures analogous to fourth contact structures 154 may not be formed within the second interconnect region 408 of the microelectronic device 400. During the formation of the microelectronic device 400, some of the fourth portion 414D of the first routing structures 414 within the third tier 413C of the first routing structures 414 within the first microelectronic device structure may be directly attached (e.g., directly bonded) to the second bond pads 450 of a second microelectronic device structure analogous to the second microelectronic device structure 103 (FIG. 2A). In addition, following the formation of a microelectronic device structure assembly analogous to microelectronic device structure assembly 105, the fifth contact structures 458 may be formed directly on the strapping structures 441 (if any, or the source structure(s) 438 and the contact pad(s) 440 if the strapping structures 441 are omitted).

Figure 6:
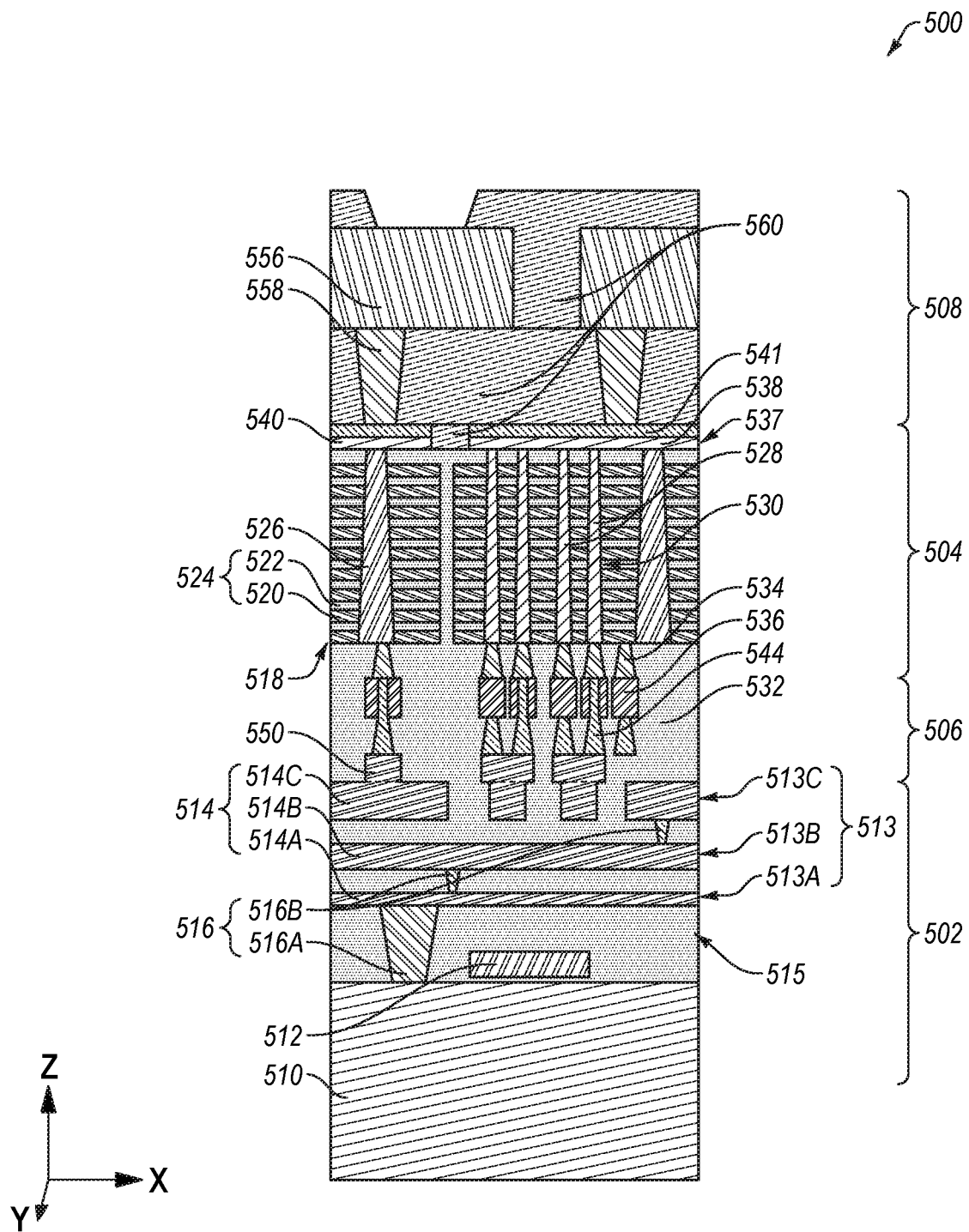
FIG. 6 is simplified, partial cross-sectional view of a microelectronic device, in accordance with yet further embodiments of the disclosure.

FIG. 6 is a simplified, partial cross-sectional view of a microelectronic device 500 (e.g., a memory device, such as a 3D NAND Flash memory device), in accordance with an additional embodiment of the disclosure. As shown in FIG. 6, the microelectronic device 500 may be similar to the microelectronic device 100 previously described with reference to FIG. 1, except that the fifth contact structures 558 of the second interconnect region 508 may be directly attached (e.g., directly bonded) to the strapping structures 541 (if any, or the source structure(s) 538 and the contact pad(s) 540 if the strapping structures 541 are omitted); and the second bond pads 550 of the first interconnect region 506 may be directly attached to some of the first routing structures 514 of the control logic region 502 of the microelectronic device 500. As shown in FIG. 6, second routing structures analogous to (e.g., corresponding to) the second routing structures 152 (FIG. 1) and fourth contact structures analogous to the fourth contact structures 154 (FIG. 1) may each be omitted (e.g., absent) from the second interconnect region 508 of the microelectronic device 500. As described in further detail below, functions (e.g., global routing functions) of the second routing structures 152 (FIG. 1) may, instead, be effectuated by one or more of the portions (e.g., the third portion 514C) of the first routing structures 514 in one or more of the tiers 513 (e.g., the third tier 513C) of the first routing structures 514. In addition, second contact structures analogous to the second contact structures 142 (FIG. 1) and first bond pads analogous to the first bond pads 148 (FIG. 1) may each be omitted (e.g., absent) from the first interconnect region 506 of the microelectronic device 500.

Still referring to FIG. 6, the first routing structures 514 may be configured such that some of the first routing structures 514 are configured to receive global signals from an external bus, and to relay the global signals to other components (e.g., structures, devices) of the microelectronic device 500; and some other of the first routing structures 514 are configured to receive local signals, and to relay the local signals to other components (e.g., structures, devices) of the microelectronic device 500. Global signal paths within the tiers 513 of the first routing structures 514 may be separate from local signal paths within the tiers 513 of the first routing structures 514. In some embodiments, at least some of the third portion 514C of the first routing structures 514 within the third tier 513C of the first routing structures 514 are configured and operated to receive and relay global signals. Other portions (e.g., the first portion 514A, the second portion 514B) of the first routing structures 514 within other of the tiers 513 (e.g., the first tier 513A, the second tier 513B) of the first routing structures 514 may be configured and operated to receive and relay local signals.

With continued reference to FIG. 6, some of the first routing structures 514 of the control logic region 502 may effectively function as both routing structures and bond pads. For example, some of the first routing structures 514 within the third tier 513C of the first routing structures 514 may effectively function as both routing structures and bond pads. In additional embodiments, contact structures (e.g., conductively filled vias) vertically extend between and couple the second bond pads 550 and the third portion 514C of the first routing structures 514 within the third tier 513C of the first routing structures 514. The second bond pads 550 may, for example, be directly attached (e.g., directly bonded) to the contact structures in a manner substantially similar to that previously described herein with respect to the direct attachment of the second bond pads 250 (FIG. 3) to the second contact structures 242 (FIG. 3).

Vertical dimensions of the first interconnect region 506 of the microelectronic device 500 and the second interconnect region 508 of the microelectronic device 500 may respectively be relatively smaller than the vertical dimensions of the first interconnect region 106 (FIG. 1) of the microelectronic device 100 (FIG. 1) and the second interconnect region 108 (FIG. 1) of the microelectronic device 100 (FIG. 1). In addition, an overall vertical dimension of the microelectronic device 500 may be relatively smaller than an overall vertical dimension of the microelectronic device 100 (FIG. 1) at least partially due to the relatively smaller vertical dimensions of the first interconnect region 506 and the second interconnect region 508 as compared to the first interconnect region 106 (FIG. 1) and the second interconnect region 108 (FIG. 1), respectively.

The microelectronic device 500 may be formed using processes similar to those previously described with reference to FIGS. 2A through 2D for the formation of the microelectronic device 100, except second contact structures analogous to the second contact structures 142 (FIGS. 1 and 2A) and first bond pads analogous to the first bond pads 148 (FIGS. 1 and 2A) may be omitted (e.g., absent) from a first microelectronic device structure analogous to the first microelectronic device structure 101 (FIG. 2A); and second routing structures analogous to the second routing structures 152 (FIGS. 1 and 2A) and fourth contact structures analogous to fourth contact structures 154 may not be formed within the second interconnect region 508 of the microelectronic device 500. During the formation of the microelectronic device 500, some of the third portion 514C of the first routing structures 514 within the third tier 513C of first routing structures 514 of a first microelectronic device structure analogous to the first microelectronic device structure 101 (FIG. 2A) may be directly attached (e.g., directly bonded) to the second bond pads 550 of a second microelectronic device structure analogous to the second microelectronic device structure 103 (FIG. 2A). In addition, following the formation of a microelectronic device structure assembly analogous to microelectronic device structure assembly 105 (FIGS. 2B and 2C), the fifth contact structures 558 may be formed directly on the strapping structures 541

(if any, or the source structure(s) 538 and the contact pad(s) 540 if the strapping structures 541 are omitted).

Microelectronic device structures and microelectronic devices (e.g., the microelectronic devices 100, 200, 300, 400, 500) in accordance with embodiments of the disclosure may be used in embodiments of electronic systems of the disclosure. For example, FIG. 7 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, an embodiment of a microelectronic device (e.g., one or more of the microelectronic devices 100, 200, 300, 400, 500) previously described herein. The electronic system 600 may further include at least one electronic signal processor device 604 (often referred to as a "microprocessor"). The electronic signal processor device 604 may, optionally, include an embodiment of a microelectronic device (e.g., one or more of the microelectronic devices 100, 200, 300, 400, 500) previously described herein. While the memory device 602 and the electronic signal processor device 604 are depicted as two (2) separate devices in FIG. 7, in additional embodiments, a single (e.g., only one) memory/processor device having the functionalities of the memory device 602 and the electronic signal processor device 604 is included in the electronic system 600. In such embodiments, the memory/processor device may include a microelectronic device (e.g., one or more of the microelectronic devices 100, 200, 300, 400, 500) previously described herein. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touchscreen device that can be used both to input information to the electronic system 600 and to output visual information to a user. The input device 606 and the output device 608 may communicate electrically with one or more of the memory device 602 and the electronic signal processor device 604.

Thus, an electronic system according to embodiments of the disclosure comprises an input device, an output device, a processor device operably coupled to the input device and the output device, and a memory device operably coupled to the processor device. The memory device comprises a stack structure, a source structure, digit lines, strings of memory cells, conductive pad structures, and control logic circuitry. The stack structure comprises tiers each comprising a conductive structure and an insulative structure vertically neighboring the conductive structure. The source structure overlies the stack structure. The digit lines underlie the stack structure. The strings of memory cells vertically extend from the source structure, through the stack structure, and to the digit lines. The conductive pad structures underlie and are in electrical communication with the digit lines. The control logic circuitry underlies and is in electrical communication with the conductive pad structures.

The devices, structures, and methods of the disclosure advantageously facilitate one or more of improved microelectronic device performance, reduced costs (e.g., manufacturing costs, material costs), increased miniaturization of components, and greater packaging density as compared to conventional devices, conventional structures, and conventional methods. The devices, structures, and methods of the disclosure may also improve scalability, efficiency, and simplicity as compared to conventional devices, conventional structures, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
   a memory array region comprising:
      a stack structure comprising vertically alternating conductive structures and insulating structures;
      vertically extending strings of memory cells within the stack structure;
      at least one source structure vertically overlying the stack structure and coupled to the vertically extending strings of memory cells;
      at least one conductive contact pad horizontally neighboring and at a vertical position of the at least one source structure, the at least one conductive contact pad electrically isolated from the at least one source structure and having a material composition substantially the same as a material composition of the at least one source structure;
      at least one deep contact structure vertically extending through the stack structure and coupled to the at least one conductive contact pad; and
      digit line structures vertically underlying the stack structure and coupled to the vertically extending strings of memory cells;
   a control logic region underlying the memory array region and comprising control logic devices configured to effectuate a portion of control operations for the vertically extending strings of memory cells; and
   an interconnect region vertically interposed between the memory array region and the control logic region and comprising structures coupling the digit line structures of the memory array region to the control logic devices of the control logic region.

2. The microelectronic device of claim 1, wherein the structures of the interconnect region comprise:
   conductive contact structures vertically underlying and directly adjacent the digit line structures;
   additional conductive contact structures vertically overlying and directly adjacent conductive routing structures within the control logic region; and
   conductive pad structures vertically extending from and between the conductive contact structures and the additional conductive contact structures.

3. The microelectronic device of claim 1, wherein the structures of the interconnect region comprise:
conductive contact structures vertically underlying and directly adjacent the digit line structures; and
conductive pad structures vertically extending from and between the conductive contact structures and conductive routing structures within the control logic region.

4. The microelectronic device of claim 1, wherein the control logic region comprises:
tiers of horizontally extending conductive routing structures; and
conductive contact structures vertically extending between and coupling the horizontally extending conductive routing structures of vertically neighboring tiers of the tiers of horizontally extending conductive routing structures.

5. The microelectronic device of claim 4, wherein at least some of the horizontally extending conductive routing structures and at least some of the conductive contact structures comprise copper.

6. The microelectronic device of claim 4, wherein at least some of the horizontally extending conductive routing structures and at least some of the conductive contact structures comprise tungsten.

7. The microelectronic device of claim 4, wherein the control logic region comprises at least three of the tiers of horizontally extending conductive routing structures.

8. The microelectronic device of claim 7, wherein:
one or more of the at least three of the tiers of horizontally extending conductive routing structures are configured to receive and relay global signals for the microelectronic device; and
one or more other of the at least three of the tiers of horizontally extending conductive routing structures are configured to receive and relay local signals for the microelectronic device.

9. The microelectronic device of claim 1, wherein the at least one source structure of the memory array region comprises conductively doped silicon.

10. A microelectronic device, comprising:
a memory array region comprising:
a stack structure comprising vertically alternating conductive structures and insulating structures;
vertically extending strings of memory cells within the stack structure;
at least one source structure vertically overlying the stack structure and coupled to the vertically extending strings of memory cells; and
digit line structures vertically underlying the stack structure and coupled to the vertically extending strings of memory cells;
a control logic region underlying the memory array region and comprising control logic devices configured to effectuate a portion of control operations for the vertically extending strings of memory cells;
an interconnect region vertically interposed between the memory array region and the control logic region and comprising structures coupling the digit line structures of the memory array region to the control logic devices of the control logic region; and
an additional interconnect region vertically overlying the memory array region and comprising:
additional structures coupled to the at least one source structure of the memory array region, the additional structures comprising:
horizontally extending conductive routing structures vertically overlying and coupled to the at least one source structure; and
conductive pad structures vertically overlying and coupled to the horizontally extending conductive routing structures;
conductive contact structures vertically interposed between and electrically connecting the at least one source structure and the horizontally extending conductive routing structures; and
additional conductive contact structures vertically extending between and electrically connecting the horizontally extending conductive routing structures and the conductive pad structures.

11. The microelectronic device of claim 10, wherein:
the horizontally extending conductive routing structures comprise copper; and
the conductive pad structures comprise aluminum.

12. The microelectronic device of claim 10, further comprising:
at least one pad structure comprising aluminum vertically overlying the at least one source structure; and
at least one contact structure comprising tungsten vertically extending between and coupling the at least one pad structure and the at least one source structure.

13. A method of forming a microelectronic device, comprising:
forming a first microelectronic device structure comprising control logic devices;
forming a second microelectronic device structure comprising:
a carrier structure;
a stack structure overlying the carrier structure and comprising vertically alternating conductive structures and insulating structures;
vertically extending strings of memory cells within the stack structure;
a deep contact structure vertically extending through the stack structure; and
digit line structures overlying the stack structure;
attaching the second microelectronic device structure to the first microelectronic device structure to form a microelectronic device structure assembly, the digit line structures vertically interposed between the stack structure and the control logic devices within the microelectronic device structure assembly;
removing the carrier structure from the microelectronic device structure assembly;
forming at least one source structure over the stack structure of the microelectronic device structure assembly and in electrical communication with the vertically extending strings of memory cells; and
forming a conductive contact pad at a vertical position of the at least one source structure, the conductive contact pad electrically isolated from the at least one source structure and in electrical communication with the deep contact structure.

14. The method of claim 13, wherein:
forming a first microelectronic device structure comprises forming the first microelectronic device structure to further comprise conductive pad structures overlying the control logic devices;
forming a second microelectronic device structure comprises forming the second microelectronic device structure to further comprise additional conductive pad structures overlying the digit line structures; and attaching the second microelectronic device structure to the first microelectronic device structure comprises bonding the conductive pad structures of the first microelectronic device structure to the additional conductive pad structures of the second microelectronic device structure.

15. The method of claim 13, wherein:
forming a second microelectronic device structure comprises forming the second microelectronic device structure to comprise conductive pad structures overlying the digit line structures; and
attaching the second microelectronic device structure to the first microelectronic device structure comprises directly attaching the conductive pad structures to conductive routing structures within the first microelectronic device structure.

16. The method of claim 13, wherein forming at least one source structure over the stack structure comprises forming the at least one source structure to comprise conductively doped silicon.

17. The method of claim 13, further comprising forming one or more of copper structures and aluminum structures over and in electrical communication with the at least one source structure.

18. A memory device, comprising:
a memory array region comprising:
a stack structure comprising a vertically alternating sequence of conductive structures and insulating structures; and
strings of memory cells vertically extending through the stack structure;
one or more source structures vertically overlying the stack structure and coupled to the strings of memory cells;
data line structures vertically underlying the stack structure and coupled to the strings of memory cells;
one or more conductive contact structures vertically extending through the stack structure; and
one or more conductive pad structures horizontally offset from and at a vertical position of the one or more source structures, the one or more conductive pad structures electrically isolated from each of the one or more source structures and in electrical communication with the one or more conductive contact structures;
a first interconnect region vertically underlying the memory array region and comprising additional conductive pad structures coupled to the data line structures;
a control logic region vertically underlying the first interconnect region and comprising complementary metal oxide semiconductor (CMOS) circuitry including conductive routing structures coupled to the additional conductive pad structures; and
a second interconnect region vertically overlying the memory array region and comprising additional conductive routing structures coupled to the one or more source structures.

19. The memory device of claim 18, further comprising:
at least one insulative material horizontally surrounding and vertically covering the additional conductive pad structures;
conductively filled vias vertically extending through portions of the at least one insulative material and coupling the data line structures to the additional conductive pad structures; and
additional conductively filled vias vertically extending through additional portions of the at least one insulative material and coupling the additional conductive pad structures to the conductive routing structures.

20. The memory device of claim 18, wherein the additional conductive pad structures are directly attached to the conductive routing structures.

21. The memory device of claim 18, wherein the conductive routing structures and the additional conductive routing structures each comprise copper.

22. An electronic system, comprising:
an input device;
an output device;
a processor device operably coupled to the input device and the output device; and
a memory device operably coupled to the processor device and comprising:
a stack structure comprising tiers each comprising a conductive structure and an insulative structure vertically neighboring the conductive structure;
a source structure overlying the stack structure;
a conductive pad structure at a vertical position of the source structure and electrically isolated from the source structure;
digit lines underlying the stack structure;
strings of memory cells vertically extending from the source structure, through the stack structure, and to the digit lines;
a conductively filled via vertically extending from the conductive pad structure, through the stack structure, and to a vertical elevation of the digit lines;
additional conductive pad structures underlying and in electrical communication with the digit lines; and
control logic circuitry underlying and in electrical communication with the additional conductive pad structures.

23. The electronic system of claim 22, wherein the memory device comprises a 3D NAND Flash memory device.

* * * * *

UNITED STATES PATENT AND TRADEMARK OFFICE
CERTIFICATE OF CORRECTION

PATENT NO. : 11,563,018 B2
APPLICATION NO. : 16/905385
DATED : January 24, 2023
INVENTOR(S) : Kunal R. Parekh Page 1 of 1

It is certified that error appears in the above-identified patent and that said Letters Patent is hereby corrected as shown below:

In the Specification

Column 5, Line 34, change "(Mgo$_x$))" to --(MgO$_x$))--
Column 5, Line 39, change "(SiC$_x$o$_y$H$_z$))" to --(SiC$_x$O$_y$H$_z$))--

Signed and Sealed this
Eighth Day of April, 2025

Coke Morgan Stewart
*Acting Director of the United States Patent and Trademark Office*